(12) United States Patent
Welch et al.

(10) Patent No.: US 11,309,462 B2
(45) Date of Patent: Apr. 19, 2022

(54) SEMICONDUCTOR LIGHT EMITTING DEVICES INCLUDING SUPERSTRATES WITH PATTERNED SURFACES

(71) Applicant: CreeLED, Inc., Durham, NC (US)

(72) Inventors: Erin Welch, Ann Arbor, MI (US); Paul Thomas Fini, Santa Barbara, CA (US); Eric Tarsa, Goleta, CA (US); Kenneth Morgan Davis, Raleigh, NC (US)

(73) Assignee: CREE LED, INC., Newark, CA (US)

( * ) Notice: Subject to any disclaimer, the term of this patent is extended or adjusted under 35 U.S.C. 154(b) by 0 days.

(21) Appl. No.: 16/390,714

(22) Filed: Apr. 22, 2019

(65) Prior Publication Data

US 2019/0326484 A1 Oct. 24, 2019

Related U.S. Application Data

(60) Provisional application No. 62/661,359, filed on Apr. 23, 2018.

(51) Int. Cl.
| | |
|---|---|
| *H01L 33/50* | (2010.01) |
| *H01L 33/58* | (2010.01) |
| *H01L 33/44* | (2010.01) |
| *H01L 33/24* | (2010.01) |
| *H01L 33/22* | (2010.01) |
| *H01L 33/32* | (2010.01) |
| *H01L 33/56* | (2010.01) |

(52) U.S. Cl.
CPC ............ *H01L 33/507* (2013.01); *H01L 33/58* (2013.01)

(58) Field of Classification Search
CPC .................................................... H01L 33/507
See application file for complete search history.

(56) References Cited

U.S. PATENT DOCUMENTS

| | | | |
|---|---|---|---|
| 10,290,777 B2 | 5/2019 | Andrews et al. | |
| 10,439,107 B2 | 10/2019 | Heikman et al. | |
| 2008/0042546 A1 | 2/2008 | Huang et al. | |
| 2012/0138981 A1* | 6/2012 | Chen ....................... | H01L 33/58 |
| | | | 257/98 |

(Continued)

FOREIGN PATENT DOCUMENTS

| | | |
|---|---|---|
| DE | 102016101442 | 7/2017 |
| WO | 2017069964 | 4/2017 |

OTHER PUBLICATIONS

Notification Concerning Transmittal of International Preliminary Report on Patentability, dated Nov. 5, 2020 for corresponding PCT International Application No. PCT/US2019/028502 (10 pages).

*Primary Examiner* — Omar F Mojaddedi
(74) *Attorney, Agent, or Firm* — Withrow & Terranova, P.L.L.C.

(57) ABSTRACT

A semiconductor light emitting device includes a light emitting diode (LED) chip, a recipient luminophoric medium on the LED chip, a patterned superstrate on the recipient luminophoric medium opposite the LED chip, the patterned superstrate comprising a patterned superstrate on the recipient luminophoric medium opposite the LED chip, the patterned superstrate comprising a patterned surface that is configured to reduce a variation in a color point of a light emitted by the semiconductor light emitting device as a function of an angle off an optical axis of the LED chip.

22 Claims, 28 Drawing Sheets
(5 of 28 Drawing Sheet(s) Filed in Color)

(56) References Cited

U.S. PATENT DOCUMENTS

2016/0079494 A1\* 3/2016 Ting .................. H01L 33/58
                                                                                         257/98
2016/0284948 A1\* 9/2016 Song ................. H01L 33/504
2018/0315901 A1\* 11/2018 Lopez ................ H01L 33/505
2018/0375002 A1\* 12/2018 Loeffler ............. H01L 33/007

\* cited by examiner

SEMICONDUCTOR LIGHT EMITTING DEVICES INCLUDING SUPERSTRATES WITH PATTERNED SURFACES

RELATED APPLICATION

This application claims the benefit, under 35 U.S.C. § 119(e), of U.S. Provisional Application Ser. No. 62/661,359, filed Apr. 23, 2018, entitled "SEMICONDUCTOR LIGHT EMITTING DEVICES INCLUDING SUPERSTRATES WITH PATTERNED SURFACES," the entire contents of which are incorporated herein in reference.

FIELD

The present disclosure relates to light emitting devices, and more particularly, to semiconductor light emitting devices that include superstrates with patterned surfaces.

BACKGROUND

Semiconductor light emitting devices are in wide use today. Semiconductor light emitting devices typically include one or more light emitting diode chips ("LEDs" or "LED chips"). Each LED chip may include a series of semiconductor layers that may be epitaxially grown on a substrate such as, for example, a sapphire, silicon, silicon carbide, gallium nitride, or gallium arsenide substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, the electrons will "collide" with corresponding holes and recombine, which causes photons of light to be emitted. The wavelength distribution of the light emitted by an LED chip generally depends on the semiconductor materials used and the structure of the thin epitaxial layers that make up the "active region" of the device, which is where the electron-hole recombination occurs.

LED chips are nearly monochromatic light sources that appear to emit light having a single color. The spectral power distribution of the light emitted by LEDs may be centered about a "peak" wavelength, which is the wavelength where the spectral power distribution of the LED chip reaches its maximum as detected by a photodetector. The width of the spectral power distribution of LED chips is typically between about 10 nm and 30 nm, where the width may be measured at half of the maximum illumination on each side of the emission peak (this width may be referred to as the full width at half maximum or "FWHM" width).

Visible light may include light having many different wavelengths. The apparent color of visible light can be illustrated with reference to a two-dimensional chromaticity diagram, such as the 1931 CIE Chromaticity Diagram illustrated in FIG. 1, which provides a reference for defining colors as weighted sums of colors. As shown in FIG. 1, colors on the CIE Chromaticity Diagram are defined by x (ccx) and y (ccy) coordinates (i.e., chromaticity coordinates) that fall within a generally U-shaped area. Colors on or near the outside of the area are saturated colors composed of light having a single wavelength, or a very small wavelength distribution, while colors on the interior of the area are unsaturated colors that are composed of a mixture of different wavelengths. White light, which can be a mixture of many different wavelengths, is generally found near the middle of the diagram, in the region labeled 10 in FIG. 1.

There are many different hues of light that may be considered "white," as evidenced by the size of the region 10. For example, some "white" light, such as light generated by high-power sodium vapor lighting devices, may appear yellowish in color, while other "white" light, such as light generated by some fluorescent lighting devices, may appear more bluish in color.

A combination of light from light sources emitting light of first and second colors may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer. Each point in the graph of FIG. 1 is referred to as the "color point" of a light source that emits a light having that color. As shown in FIG. 1 a locus of color points that is referred to as the "black-body" locus 15 exists which corresponds to the location of color points of light emitted by a black-body radiator that is heated to various temperatures. The black-body locus 15 is also referred to as the "Planckian" locus because the chromaticity coordinates (i.e., color points) that lie along the black-body locus obey Planck's equation: $E(\lambda)=A \lambda^{-5}/(e^{B/T}-1)$, where E is the emission intensity, $\lambda$ is the emission wavelength, T is the color temperature of the black-body and A and B are constants. Color points that lie on or near the black-body locus 15 yield pleasing white light to a human observer.

As a heated object becomes incandescent, it first glows reddish, then yellowish, and finally bluish with increasing temperature. This occurs because the wavelength associated with the peak radiation of the black-body radiator becomes progressively shorter with increased temperature, consistent with the Wien Displacement Law. Illuminants that produce light which is on or near the black-body locus 15 can thus be described in terms of their correlated color temperature (CCT). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color.

A semiconductor light emitting device that emits white light may be provided by surrounding an LED chip with one or more luminescent materials, such as phosphors, that absorb some of the light emitted by the LED chip and responsively emit light of one or more other colors. This process is also referred to herein as 'converting' some of the light emitted by the LED chip to the light of the other color(s). The combination of the light emitted by the LED that is not converted by luminescent materials and the light of other color(s) that are emitted by the luminescent materials may produce light that appears to be white or near white to an observer.

As one example, a white light emitting LED package may be formed by coating a gallium nitride-based blue LED (i.e., an LED that emits light having a peak wavelength in the blue color range as defined herein) with a "yellow" phosphor (i.e., a phosphor that emits light having a peak wavelength in the yellow color range) such as a cerium-doped yttrium aluminum garnet phosphor, which has the chemical formula $Y_3Al_5O_{12}$:Ce, and is commonly referred to as YAG:Ce. The blue LED emits light having a peak wavelength of, for example, about 460 nm. Some of blue light emitted by the LED passes between and/or through the YAG:Ce phosphor particles without being converted, while other of the blue light emitted by the LED is absorbed by the YAG:Ce phosphor, which becomes excited and emits broad-spectrum fluorescence having a peak wavelength of about 550 nm. The broad spectrum light emitted by the YAG:Ce phosphor may include light of many different colors (e.g., green, yellow, orange and even red light) and generally appears yellowish in color as the peak intensity of the emitted light is in the yellow color range. The combination of blue light from the LED that is not converted by the YAG:Ce phosphor and light of other colors that is emitted by the YAG:Ce phosphor may appear white to an observer. Such light is typically perceived as being cool white in color, as it primarily comprises light on the lower half (shorter wavelength side) of the visible emission spectrum. To make the emitted white light appear more "warm" and/or exhibit better color rendering properties, phosphors particles that emit light having a peak wavelength in the red color range, such as $Eu^{2+}$ doped $CaAlSiN_3$ based phosphors, may be added to the coating applied to the blue LED.

In general, phosphors absorb light having first wavelengths and re-emit light having second wavelengths that are different (typically longer) than the first wavelengths. For example, "down-conversion" phosphors may absorb light having shorter wavelengths and re-emit light having longer wavelengths. It will be understood that the term "phosphor" is used broadly herein to encompass not only materials that have traditionally been referred to as phosphorescent, but also other luminophoric materials such as, for example, quantum dots, that absorb light at one wavelength and re-emit light at a different wavelength in the visible spectrum.

Typically, particles of a phosphor are mixed into a binder material such as, for example, an epoxy-based or silicone-based curable resin, and are then coated, sprayed or poured onto an LED or another surface of a light fixture. Herein, such mixtures are referred to as a "recipient luminophoric medium." A recipient luminophoric medium may include one layer or the like in which one or more phosphors are mixed, multiple stacked layers, each of which may include one or more of the same or different phosphors, and/or multiple spaced apart layers, each of which may include the same or different phosphors.

SUMMARY

Pursuant to some embodiments of the present invention, a semiconductor light emitting device includes a light emitting diode (LED) chip, a recipient luminophoric medium on the LED chip, and a patterned superstrate on the recipient luminophoric medium opposite the LED chip, the patterned superstrate comprising a patterned surface that is configured to reduce a variation in a color point of a light emitted by the semiconductor light emitting device as a function of an angle off an optical axis of the LED chip.

In some embodiments, wherein the patterned surface comprises a plurality of optical elements.

In some embodiments, the plurality of optical elements are configured to reduce an amount of light emitted by the semiconductor light emitting device while reducing a variation in a color point of the light emitted by the semiconductor light emitting device as a function of viewing angle.

In some embodiments, wherein at least one of the plurality of optical elements comprises a convex protrusion.

In some embodiments, the convex protrusion comprises a non-linear sidewall.

In some embodiments, at least one of the plurality of optical elements comprises a concave indentation.

In some embodiments, at least one of the plurality of optical elements has a circular cross-section.

In some embodiments, at least one of the plurality of optical elements has a polygonal shaped cross-section.

In some embodiments, the plurality of optical elements are arranged on the patterned superstrate in a grid.

In some embodiments, a surface of the patterned superstrate opposite the patterned surface is a substantially planar surface.

In some embodiments, the plurality of optical elements are on a top surface of the patterned superstrate.

In some embodiments, the plurality of optical elements are on a bottom surface of the patterned superstrate.

In some embodiments, a height of at least one of the plurality of optical elements is between 1 and three micrometers (μm) and a width of the at least one of the plurality of optical elements is between two and four μm.

In some embodiments, a pitch of the plurality of optical elements is between 0.5 and 10 μm.

In some embodiments, a pitch of the plurality of optical elements is between 0.5 to 10 times the width of a respective one of the plurality of optical elements.

In some embodiments, the patterned surface is a first patterned surface, the patterned superstrate comprises a second patterned surface on an opposite side of the patterned superstrate from the first patterned surface, and the plurality of optical elements comprises first optical elements on the first patterned surface and second optical elements on the second patterned surface.

In some embodiments, the patterned superstrate directly contacts the recipient luminophoric medium.

In some embodiments, the semiconductor light emitting device further includes an air gap between the patterned superstrate and the recipient luminophoric medium.

In some embodiments, the patterned superstrate comprises a first patterned superstrate, and the semiconductor light emitting device further comprises a second superstrate on the first patterned superstrate, the second superstrate having a major surface adjacent the patterned surface of the first patterned superstrate.

In some embodiments, the first patterned superstrate comprises a plurality of first optical elements, and the second superstrate comprises a second patterned superstrate comprising a plurality of second optical elements.

In some embodiments, the first patterned superstrate comprises a first index of refraction, and the second superstrate comprises a second index of refraction, different from the first index of refraction.

In some embodiments, the semiconductor light emitting device further includes an adhesive layer between the recipient luminophoric medium and the LED chip.

In some embodiments, wherein the patterned superstrate is transparent.

In some embodiments, the patterned surface is configured to reduce the variation in both a ccx and ccy coordinate of the light emitted by the semiconductor light emitting device to within 0.01 for substantially all viewing angles within 40 degrees of an optical axis that extends through the LED chip and that is normal to a major surface of the LED chip.

Pursuant to some embodiments of the present invention, a semiconductor light emitting device includes a light emitting diode (LED) chip, and a chip cover mounted directly on the LED chip. The chip cover includes a patterned superstrate that comprises a plurality of optical elements, and a recipient luminophoric medium on the patterned superstrate, wherein the recipient luminophoric medium is between the LED chip and the patterned superstrate.

In some embodiments, at least one of the plurality of optical elements comprises a convex protrusion.

In some embodiments, the convex protrusion comprises a non-linear sidewall.

In some embodiments, at least one of the plurality of optical elements comprises a concave indentation.

In some embodiments, at least one of the plurality of optical elements has a circular cross-section.

In some embodiments, at least one of the plurality of optical elements has a polygonal shaped cross-section.

In some embodiments, the plurality of optical elements are arranged on the patterned superstrate in a grid.

In some embodiments, the patterned superstrate comprises a patterned surface, and a surface of the patterned superstrate opposite the patterned surface is a substantially planar surface.

In some embodiments, the plurality of optical elements are on a top surface of the patterned superstrate.

In some embodiments, wherein the plurality of optical elements are on a bottom surface of the patterned superstrate.

In some embodiments, the patterned superstrate directly contacts the recipient luminophoric medium.

In some embodiments, the semiconductor light emitting device further includes an air gap between the patterned superstrate and the recipient luminophoric medium.

In some embodiments, the patterned superstrate comprises sapphire, silicon carbide, fused silica, and/or glass.

In some embodiments, the plurality of optical elements are configured to reduce an amount of light emitted by the semiconductor light emitting device while reducing a variation in a color point of light emitted by the semiconductor light emitting device as a function of viewing angle.

In some embodiments, wherein a height of at least one of the plurality of optical elements is between 1 and three micrometers (μm) and a width of the at least one of the plurality of optical elements is between two and four μm.

In some embodiments, a pitch of the plurality of optical elements is between 0.5 and 10 μm.

In some embodiments, a pitch of the plurality of optical elements is between 0.5 to 10 times the width of a respective one of the plurality of optical elements.

In some embodiments, the patterned superstrate comprises a first patterned superstrate having a patterned surface, and the semiconductor light emitting device further comprises a second superstrate on the first patterned superstrate, the second superstrate having a major surface adjacent the patterned surface of the first patterned superstrate.

In some embodiments, wherein the first patterned superstrate comprises a plurality of first optical elements, and the second superstrate comprises a second patterned superstrate comprising a plurality of second optical elements.

In some embodiments, the first patterned superstrate comprises a first index of refraction, and the second superstrate comprises a second index of refraction, different from the first index of refraction.

In some embodiments, the semiconductor light emitting device further includes an adhesive layer between the recipient luminophoric medium and the LED chip.

In some embodiments, the patterned superstrate is transparent.

In some embodiments, the patterned superstrate comprises a first patterned surface and a second patterned surface on an opposite side of the patterned superstrate from the first patterned surface, and the plurality of optical elements comprises first optical elements on the first patterned surface and second optical elements on the second patterned surface.

In some embodiments, the patterned superstrate is configured to reduce a variation in both a ccx and ccy coordinate of light emitted by the semiconductor light emitting device to within 0.01 for substantially all viewing angles within 40 degrees of an optical axis that extends through the LED chip and that is normal to a major surface of the LED chip.

Pursuant to some embodiments of the present invention, a semiconductor light emitting device includes a light emitting diode (LED) chip, a recipient luminophoric medium on the LED chip, and a patterned superstrate on the recipient luminophoric medium opposite the LED chip, the patterned superstrate comprising a patterned surface that is configured to reduce a variation in both a ccx and a ccy color coordinate of a light emitted by the semiconductor light emitting device to within 0.01 for substantially all viewing angles within 40 degrees of an optical axis that extends through the LED chip and that is normal to a major surface of the LED chip.

In some embodiments, the recipient luminophoric medium comprises a phosphor material and a binder material, and a difference in between a first index of refraction of the binder material and a second index of refraction of the patterned superstrate is at least 0.3.

In some embodiments, the patterned surface comprises a plurality of optical elements.

In some embodiments, the plurality of optical elements redirect a portion of light emitted from the LED chip that is at least 45° from the optical axis to within 30° from the optical axis that extends through the LED chip and that is normal to the major surface of the LED chip.

In some embodiments, the plurality of optical elements redirect a portion of light emitted from the LED chip that is at least 10° from the optical axis to more than 30° from the optical axis that extends through the LED chip and that is normal to the major surface of the LED chip.

In some embodiments, at least one of the plurality of optical elements comprises a convex protrusion.

In some embodiments, the convex protrusion comprises a non-linear sidewall.

In some embodiments, at least one of the plurality of optical elements comprises a concave indentation.

In some embodiments, at least one of the plurality of optical elements has a circular cross-section.

In some embodiments, at least one of the plurality of optical elements has a polygonal shaped cross-section.

In some embodiments, a surface of the patterned superstrate opposite the patterned surface is a substantially planar surface.

In some embodiments, the plurality of optical elements are on a top surface of the patterned superstrate.

In some embodiments, the plurality of optical elements are on a bottom surface of the patterned superstrate.

In some embodiments, the plurality of optical elements are configured to reduce an amount of light emitted by the semiconductor light emitting device while reducing a variation in a color point of the light emitted by the semiconductor light emitting device as a function of viewing angle.

In some embodiments, a height of at least one of the plurality of optical elements is between 1 and three micrometers and a width of the at least one of the plurality of optical elements is between two and four μm.

In some embodiments, a pitch of the plurality of optical elements is between 0.5 and 10 micrometers.

In some embodiments, a pitch of the plurality of optical elements is between 0.5 to 10 times the width of a respective one of the plurality of optical elements.

In some embodiments, the plurality of optical elements are arranged on the patterned superstrate in a grid.

In some embodiments, the grid is hexagonal.

In some embodiments, the plurality of optical elements are arranged in an irregular pattern on the patterned superstrate.

In some embodiments, the patterned surface is a first patterned surface, the patterned superstrate comprises a second patterned surface on an opposite side of the patterned superstrate from the first patterned surface, and the plurality of optical elements comprises first optical elements on the first patterned surface and second optical elements on the second patterned surface.

In some embodiments, the patterned surface is configured to reduce the variation in both the ccx and ccy coordinate of the light emitted by the semiconductor light emitting device to within 0.005 for substantially all viewing angles within 40 degrees of the optical axis that extends through the LED chip and that is normal to the major surface of the LED chip.

In some embodiments, the patterned superstrate is transparent.

In some embodiments, the patterned superstrate directly contacts the recipient luminophoric medium.

In some embodiments, the semiconductor light emitting device further includes an air gap between the patterned superstrate and the recipient luminophoric medium.

In some embodiments, the patterned superstrate comprises sapphire, silicon carbide, fused silica, and/or glass.

In some embodiments, the patterned superstrate comprises a first patterned superstrate, and the semiconductor light emitting device further comprises a second superstrate on the first patterned superstrate, the second superstrate having a major surface adjacent the patterned surface of the first patterned superstrate.

In some embodiments, the first patterned superstrate comprises a plurality of first optical elements, and the second superstrate comprises a second patterned superstrate comprising a plurality of second optical elements.

In some embodiments, the first patterned superstrate comprises a first index of refraction, and the second superstrate comprises a second index of refraction, different from the first index of refraction.

BRIEF DESCRIPTION OF THE DRAWINGS

The patent or application file contains at least one drawing executed in color. Copies of this patent or patent application publication with color drawings will be provided by the Office upon request and payment of the necessary fee.

Figure 1:
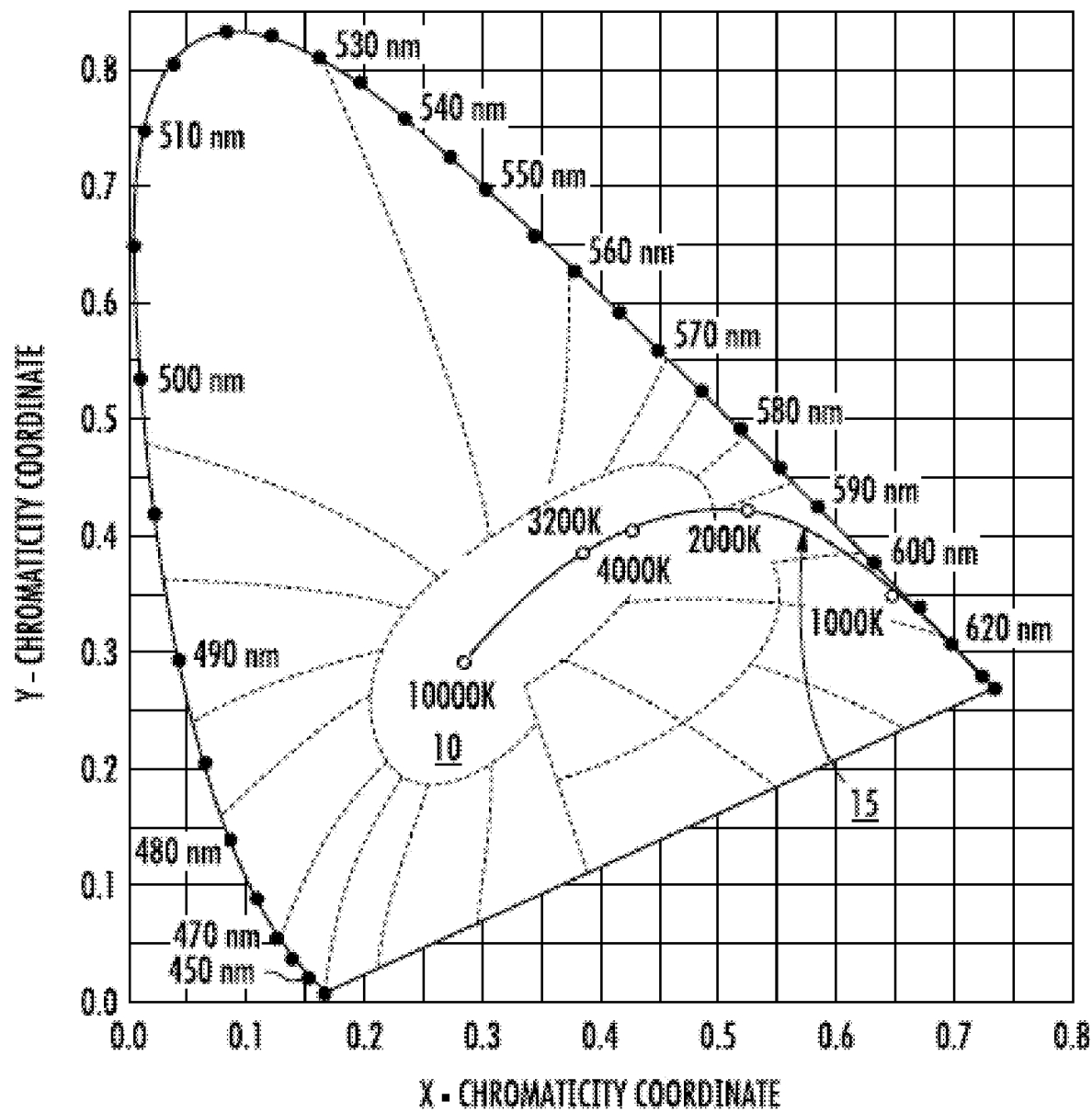
FIG. 1 illustrates the 1931 CIE Chromaticity Diagram for defining colors by chromaticity coordinates.

It should be noted that these figures are intended to illustrate the general characteristics of methods, structure, and/or materials utilized in certain example embodiments and to supplement the written description provided below. These drawings are not, however, to scale and may not precisely reflect the structural or performance characteristics of any given embodiment, and should not be interpreted as defining or limiting the range of values or properties encompassed by example embodiments described herein. For example, the relative thicknesses and positioning of layers, regions, and/or structural elements may be reduced or exaggerated for clarity. The use of similar or identical reference numbers in the various drawings is intended to indicate the presence of a similar or identical element or feature.

DETAILED DESCRIPTION

Pursuant to embodiments of the present invention, the consistency of the color of the light emitted by a semiconductor light emitting device over a range of viewing angles may be improved by the addition of a patterned superstrate that is placed on a recipient luminophoric medium of the semiconductor light emitting device opposite the LED chip(s). The addition of the patterned superstrate may alter the characteristics of the light emitted by the semiconductor light emitting device so as to provide a more uniform color to the emitted light when viewed from different angles.

Conventional semiconductor light emitting devices utilizing an LED chip with a recipient luminophoric medium may emit light that exhibits a variation in the color of the emitted light as the viewing angle of the emitted light is changed. For example, a color of light emitted from a semiconductor light emitting device may be a first color when the semiconductor light emitting device is viewed directly, e.g., straight on, to the semiconductor light emitting device, but the color may be a second color as the viewing angle increases with respect to the straight-on view. In other words, the perceived color of the light emitted from a semiconductor light emitting device may differ when viewed from an oblique angle as opposed to when viewed from straight ahead. The variation of the color of the light emitted by the semiconductor light emitting device over various viewing angles is known as the Color-over-Angle (CoA) variation of the device.

According to embodiments described herein, the CoA performance of a semiconductor light emitting device may be improved by including a patterned superstrate in the semiconductor light emitting device that has a plurality of optical elements formed therein. The patterned superstrate may be positioned to receive the light that is emitted from the recipient luminophoric medium, which includes both the light emitted by the phosphors in the recipient luminophoric medium and unconverted light from the LED chip. As discussed herein, the use of this patterned superstrate may introduce additional refraction and/or reflection to the emitted light so as to improve the CoA variation of the emitted light over a large range of viewing angles.

According to some embodiments of the present invention, semiconductor light emitting devices are provided that include an LED chip, a recipient luminophoric medium on the LED chip, and a patterned superstrate on the recipient luminophoric medium opposite the LED chip. The patterned superstrate may be a patterned surface that reduces the variation in the color point of the light emitted by the semiconductor light emitting device as a function of an angle off a line normal to an emitting surface of the LED chip.

According to further embodiments of the present invention, semiconductor light emitting devices are provided that include an LED chip and a chip cover mounted directly on the LED chip. The chip cover may include a patterned superstrate that includes a plurality of optical elements and a recipient luminophoric medium that is on the patterned superstrate. The recipient luminophoric medium may be positioned between the LED chip and the patterned superstrate.

According to additional embodiments of the present invention, semiconductor light emitting devices are provided that include an LED chip, a recipient luminophoric medium on the LED chip, and a patterned superstrate on the recipient luminophoric medium opposite the LED chip. The patterned superstrate includes a patterned surface that is configured to reduce the variation in both the ccx and ccy color coordinates of the emitted light to within 0.01 for substantially all viewing angles within 40 degrees of an axis that extends normal to a major surface of the LED chip.

Example embodiments of the present invention will now be described in greater detail with reference to the figures.

Figure 2:
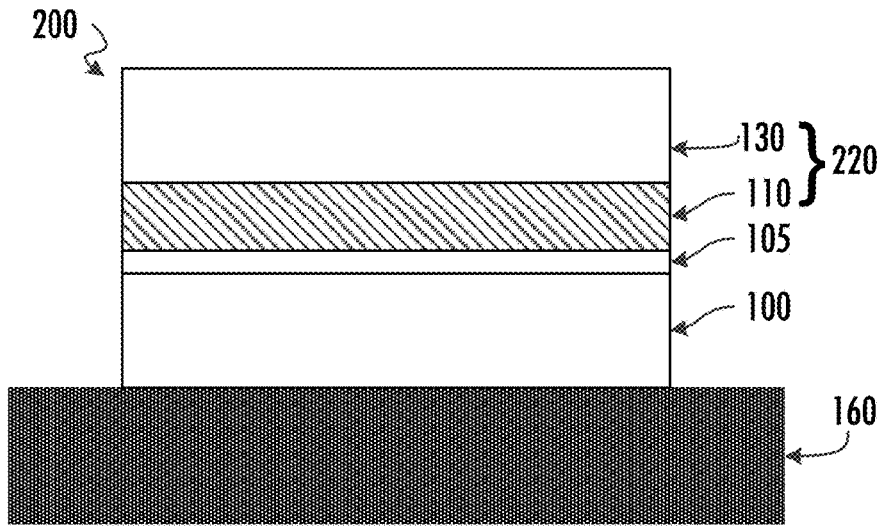
FIG. 2 is a schematic cross-sectional view of a conventional semiconductor light emitting device that includes a chip cover.

FIG. 2 is a schematic cross-sectional view of a conventional semiconductor light emitting device 200 that includes a chip cover 220. As shown in FIG. 2, the chip cover 220 comprises a superstrate 130 that has a recipient luminophoric medium 110 disposed thereon. The chip cover 220 may substantially cover the LED chip 100, and may be positioned so that the recipient luminophoric medium 110 is between the LED chip 100 and the superstrate 130. The LED chip 100, in turn, may be mounted on a support substrate 160 such as, for example, a ceramic substrate. The support substrate 160 may have a reflective upper surface so that light impinging on the support substrate 160 is redirected back through the LED chip 100. The superstrate 130 may protect a surface of the recipient luminophoric medium 110. Superstrates are discussed, for example, in U.S. patent application Ser. No. 15/657,027 to Andrews et al. entitled "Light Emitting Diodes, Components and Related Methods." The recipient luminophoric medium 110 is typically sprayed and/or otherwise coated on a surface of the superstrate 130. Recipient luminophoric mediums are discussed, for example, in U.S. patent application Ser. No. 14/053,404 to Heilman et al. entitled "Chip with Integrated Phosphor." The chip cover 220 may then be attached to the LED chip 100 using a layer of transparent adhesive 105 to provide the semiconductor light emitting device 200. The term "superstrate" is used herein to refer to a layer placed on an LED chip with a recipient luminophoric medium between the superstrate and the LED chip. It will be understood that the superstrate may be on either side of the LED chip. For example, in a flip-chip configuration, the superstrate may be below the LED chip. The term "superstrate" is used herein, in part, to avoid confusion with other substrates that may be part of the semiconductor light emitting device, such as the substrate of the LED chip. The term "superstrate" is not intended to limit the orientation, location, and/or composition of the structure it describes.

Figure 3A:
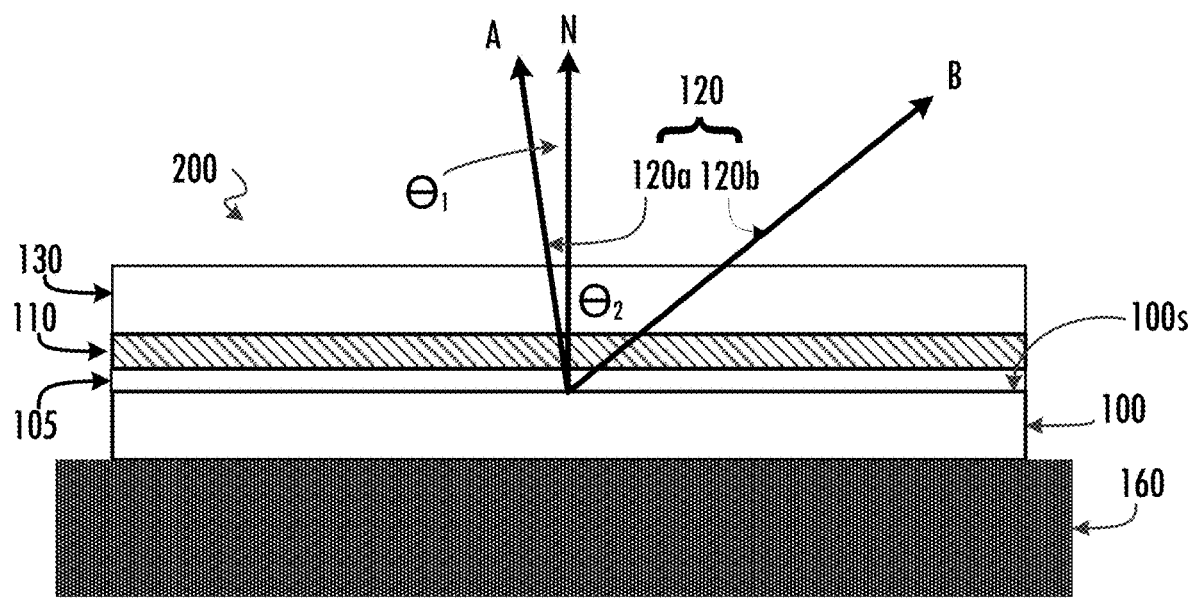
FIG. 3A is a schematic cross-sectional view of a conventional semiconductor light emitting device illustrating various viewing angles of light emitted from the device.

FIG. 3A is a schematic cross-sectional view of the semiconductor light emitting device 200 of FIG. 2 that illustrates various viewing angles θ of the light that is emitted from the device 200. As illustrated in FIG. 3A, the LED chip 100 may have an emitting surface 100s through which light is emitted. The emitting surface 100s may be a major surface of the LED chip 100 through which a majority of the light emitted by the LED chip 100 passes into the recipient luminophoric medium 110. The emitting surface 100s may be, for example, a top surface or a bottom surface of the LED chip 100. The light emitted by the LED chip 100 passes into the recipient luminophoric medium 110. The recipient luminophoric medium 110 may convert some of the light emitted from the LED chip 100 into light of one or more different colors, while other of the light emitted by the LED chip 100 may pass through the recipient luminophoric medium without being converted. The emitted light 120 that is output from the semiconductor light emitting device 200 thus includes both unconverted light that is generated by the LED chip 100 as well as light emitted by the recipient luminophoric medium 110.

As illustrated in FIG. 3A, the emitted light 120 may include light emitted at a plurality of angles. For example, the emitted light 120 may include a first light component 120a that is emitted at a relatively small angle $\theta_1$ with respect to an optical axis N (e.g., an optical axis) that is normal to the emitting surface 100s of the LED chip 100. The optical axis N may also be referred to herein as a "surface normal" of the semiconductor light emitting device. Though the optical axis N may be described with respect to the emitting surface 100s of the LED chip 100, it will be understood that, in some embodiments, an emitting surface 100s may include a non-linear and/or variable surface. Further, in some embodiments, a substantial portion of light may be emitted through other surfaces such as the vertical LED surfaces adjacent to the surface 100s. Typically, the optical axis N refers to a direction which corresponds to the peak emitted luminous intensity of the device. The first emitted light component 120a may be perceived by an observer observing the semiconductor light emitting device 200 from a position that primarily faces the semiconductor light emitting device 200, e.g., position A in FIG. 3A.

In addition, the emitted light 120 may include a second emitted light component 120b that is emitted along a line that is at an angle $\theta_2$ to the optical axis N that is normal to the emitting surface 100s of the LED chip 100. The second light component 120b may be perceived by an observer observing the semiconductor light emitting device 200 from a position that is primarily oriented at a relatively large angle with respect to the emitting surface 100s of the LED chip 100, e.g., position B in FIG. 3A.

Figure 3B:
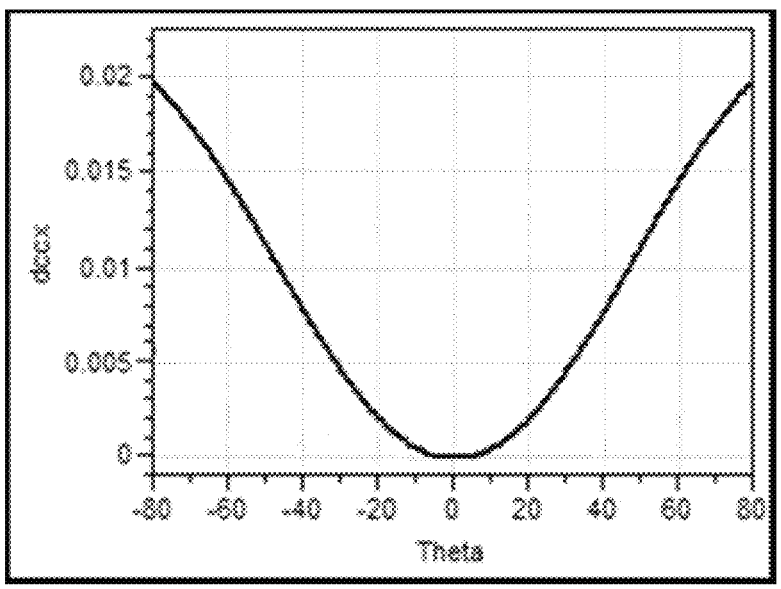
FIGS. 3B and 3C are graphs illustrating a relationship between a change in perceived color of light emitted from the conventional semiconductor light emitting device and a viewing angle of the emitted light.
Figure 3C:
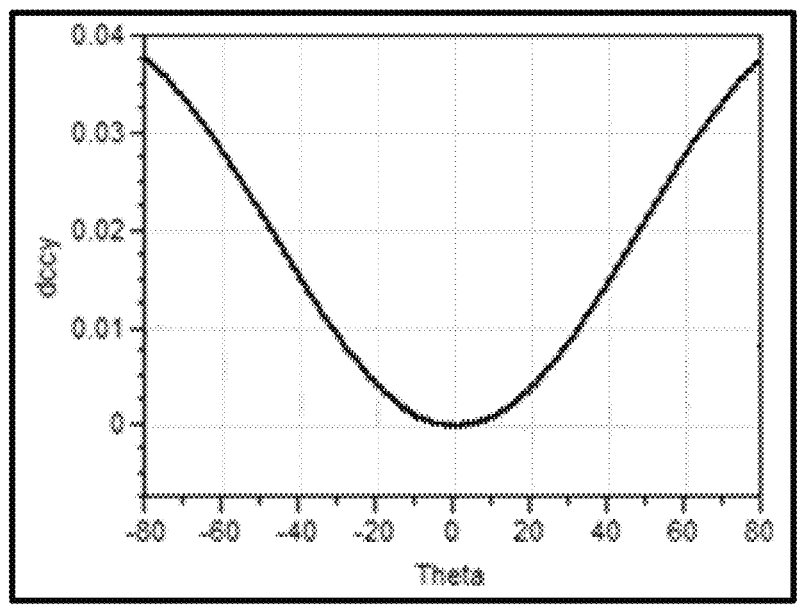

As the viewing angle θ increases, the color of the emitted light 120 may also change FIGS. 3B and 3C are graphs illustrating a relationship between a change in color of light emitted from the conventional semiconductor light emitting device 200 and a viewing angle θ of the emitted light 120. Referring to FIG. 3B, the x-axis illustrates a viewing angle θ of light with respect to the emitting surface 100s of an LED chip 100. A viewing angle θ of 0 degrees indicates a viewing perspective that is oriented along the optical axis N. Increasing (and decreasing) angles of the viewing angle θ indicate viewing perspectives that are oriented along angles that are offset from the optical axis N that is normal to the emitting surface 100s of the LED chip 100 (e.g., such as points A and B in FIG. 3A).

In FIG. 3B, the y-axis illustrates a change in the ccx component (dccx) of the emitted light 120 of the LED chip 100 as designated in the 1931 CIE Chromaticity Diagram as a function of the viewing angle θ. The change is relative to the color perceived along the optical axis N of the semiconductor light emitting device 200 (e.g., a viewing angle θ of zero degrees). For example, referring to FIG. 1, a change in a ccx component of the emitted light 120 may represent movement of the color point of the emitted light 120 in the X direction within the 1931 CIE Chromaticity Diagram. FIG. 3C illustrates similar changes in the ccy component (dccy) of the color of the emitted light 120 as a function of the viewing angle θ (relative to the perceived color at a viewing angle θ of 0 degrees). Thus, as illustrated in FIGS. 3B and 3C, as the viewing angle θ increases with respect to the optical axis N, the color of the emitted light 120 may change in both the ccx and ccy directions. As a result of these changes, the color point of the light may change as the viewing angle θ changes with respect to the semiconductor light emitting device 200, which may result in a perceptible color difference between light viewed from a first angle (e.g., at position A of FIG. 3A) and light viewed from a second angle (e.g., at position B of FIG. 3A).

The alteration in color may be due, in part, to differing paths taken by different components of the emitted light 120 as it passes through the recipient luminophoric medium 110. Referring again to FIG. 3A, the first emitted light component 120a which passes through the recipient luminophoric medium 110 along a line that is at a relatively small angle $\theta_1$ from the optical axis N may take a relatively direct path through the recipient luminophoric medium 110. In contrast, the second emitted light component 120b which passes through the recipient luminophoric medium 110 at a relatively larger angle $\theta_2$ from the optical axis N traverses a greater distance through the recipient luminophoric medium 110 than the first emitted light component 120a. As a result, a greater proportion of the second emitted light component 120b may be converted by the luminescent materials of the recipient luminophoric medium 110 than that of the first emitted light component 120a. Thus, light emitting at greater angles from the optical axis N may include more "converted light" (i.e., light emitted by the luminescent materials in the recipient luminophoric medium 110) and less "pass-through light" (i.e., light emitted by the LED chip 100 that passes through the recipient luminophoric medium without wavelength conversion) than light emitted at smaller angles from the optical axis N.

Conventional semiconductor light emitting devices have attempted to address this CoA variation by providing diffuser layers (e.g., layers including particles of $TiO_2$, fused silica, etc.) on top of the recipient luminophoric medium 110. However, such diffuser layers may result in a degradation of sharpness and/or contrast of the light emitted from the device as compared to conventional semiconductor light emitting devices without such layers, which may be relevant in some applications, and may also increase the cost of the device. Further, diffusing layers may scatter a significant portion of the light backwards towards the LED chip 100 where it is subject to possible absorption, thereby decreasing the overall efficiency of the LED chip 100 relative to the case where the scatterer is not present. It is therefore generally desirable to utilize optical effects such as refraction and total internal reflection (TIR) to mix the light sufficiently while minimizing the amount of light directed backwards towards potentially absorbing surfaces.

Figure 4:
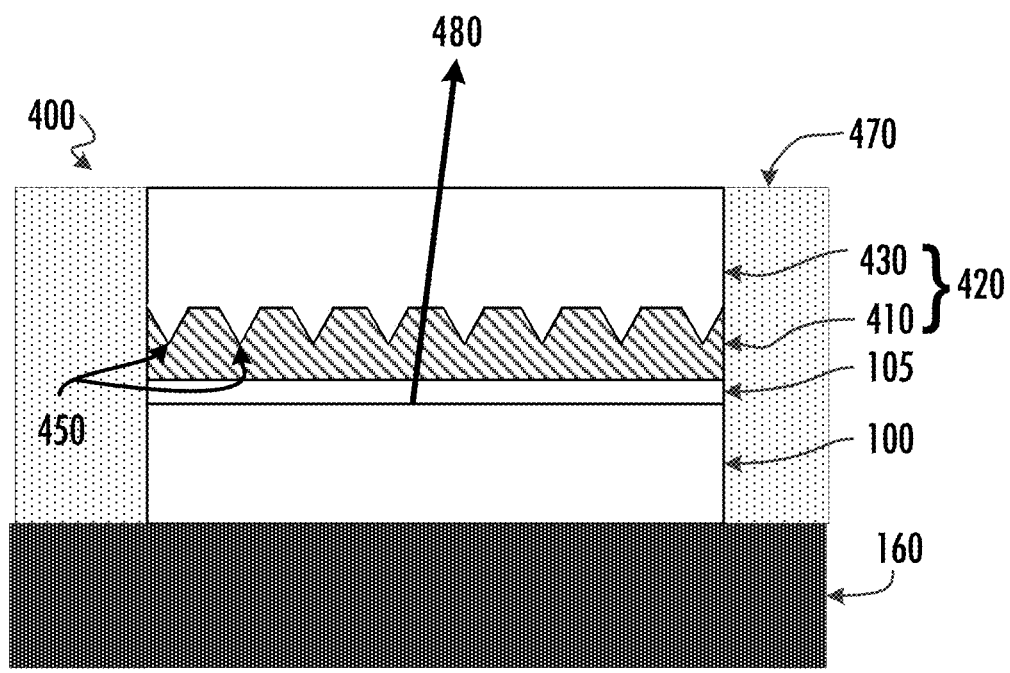
FIG. 4 is a schematic cross-sectional view of a semiconductor light emitting device according to embodiments of the present invention.

FIG. 4 is a schematic cross-sectional view of a semiconductor light emitting device 400 according to embodiments of the present invention. The semiconductor light emitting device 400 of FIG. 4 includes an LED chip 100 on a support substrate 160 as in the conventional device of FIG. 2. However, the semiconductor light emitting device 400 of FIG. 4 includes an improved chip cover 420. The improved chip cover 420 includes a recipient luminophoric medium 410 and a patterned superstrate 430. The patterned superstrate 430 may include a plurality of structures that are configured to redirect some of the light that is incident on the patterned superstrate 430 from the recipient luminophoric medium 410 in an advantageous manner. In some embodiments, the structures may be on one or more surfaces of the patterned superstrate 430. In other embodiments, the structures may be within an internal region of the patterned superstrate 430.

The structures included in the patterned superstrate 430 may be referred to herein as optical elements 450. The optical elements 450 are features that are formed in the patterned superstrate 430 that may be differentiated from random variations that may occur either naturally and/or as an unintentional byproduct of manufacturing operations. In some embodiments, the optical elements 450 may be provided as a grid or other repetitive configuration. In some embodiments, the optical elements 450 may be protrusions (e.g., convex extensions from the patterned superstrate 430) and/or indentations (e.g., concave features in the patterned superstrate 430) in a surface of the patterned superstrate 430. In some embodiments, the optical elements 450 may be structural variations in a surface of the patterned superstrate 430 that are deliberately placed to aid in optical reflection. In some embodiments, the optical elements 450 may be on multiple portions of the surface of the patterned superstrate 430, including the edges and center of the surface of the patterned superstrate 430. In some embodiments, the optical elements 450 may have a uniform shape and spacing across the patterned superstrate 430, while in other embodiments the spacing or shape may vary by design across the patterned superstrate 430.

Though illustrated as structures having triangular cross-sections in FIG. 4, the shape of the optical elements 450 may vary in size and configuration, as described further herein, and the shape of the optical elements 450 in FIG. 4 is merely for illustration. The optical elements 450 may be configured to further reflect the emitted light 480 that is emitted from the recipient luminophoric medium (which may include both pass-through light and converted light) so as to improve the CoA variation of the semiconductor light emitting device 400.

As shown in FIG. 4, the recipient luminophoric medium 410 may be positioned between the optical elements 450 of the patterned superstrate 430 and the LED chip 100. In some embodiments, the recipient luminophoric medium 410 may have a thickness of between 10 micrometers (μm) to 100 μm. In some embodiments, the patterned superstrate 430 may have a thickness of between 125 μm to 165 μm.

In some embodiments, the patterned superstrate 430 may be composed of, for example, sapphire, silicon carbide, silicone, and/or glass (e.g., borosilicate and/or fused quartz). The patterned superstrate 430 may be formed from a bulk substrate which is patterned and then singulated. In some embodiments, the patterning of the bulk substrate may be performed by an etching process (e.g., wet or dry etching). In some embodiments, the patterning of the bulk substrate may be performed by otherwise altering the surface, such as by a laser or saw. In some embodiments, the bulk substrate may be thinned before or after the patterning process is performed. The recipient luminophoric medium 410 may then be placed on the bulk substrate by, for example, spraying and/or otherwise coating the bulk substrate with the recipient luminophoric medium 410. Typically the recipient luminophoric medium 410 is applied to the bulk substrate which is thereafter singulated, e.g., with a laser or mechanical saw, to form individual chip covers 420 including the recipient luminophoric medium 410 and the patterned superstrate 430, but embodiments of the present invention are not limited thereto. The chip covers 420 may be attached to the LED chip 100 using, for example, a layer of transparent adhesive 105. In some embodiments, the layer of transparent adhesive 105 may be about 5 μm thick. The individual chip covers 420 may be placed on the LED chips 100 using, for example, a pick-and-place manufacturing process.

Though the patterned superstrate 430 is illustrated as being part of the chip cover 420, embodiments of the present invention are not limited thereto. It will be understood that the semiconductor light emitting device 400 may be formed utilizing the patterned superstrate 430 and recipient luminophoric medium 410 without forming an intermediate improved chip cover 420. For example, in some embodiments, the recipient luminophoric medium 410 may be placed on the LED chip 100, such as, for example, through spraying, pouring, or coating, and the patterned superstrate 430 may be placed on the recipient luminophoric medium 410, such as through a pick-and-place operation. In other words, the recipient luminophoric medium 410 and the patterned superstrate 430 may be individually placed on the LED chip 100 without first forming a separate chip cover 420. In such embodiments, the transparent adhesive layer 105 may not be present, though the embodiments described herein are not limited thereto. For example, if the LED chip 100 is configured in a flip-chip configuration, the transparent adhesive layer 105 may not be present.

FIG. 4 also includes an opaque fill region 470. The opaque fill region 470 may include a highly reflective surrounding material which may suppress side light emission from the semiconductor light emitting device 400 in favor of top light emission, which is preferred. In some embodiments, the opaque fill region 470 may be composed of silicone material and/or scattering particles. The opaque fill region 470 illustrated in FIG. 4 may be included in each of the embodiments described herein. However, the opaque fill region 470 may be omitted from the various illustrations of the semiconductor light emitting devices included herein for brevity.

The structure of the semiconductor light emitting device 400 illustrated in FIG. 4 is intended to be representative, but the embodiments of the present invention are not limited thereto. For example, additional layers may be present between the LED chip 100 and the patterned superstrate 430 and/or on the patterned superstrate 430, such as adhesive layers, diffusing layers (e.g., an adhesive with scattering particles), reflective and/or wavelength conversion layers.

Figure 5A:
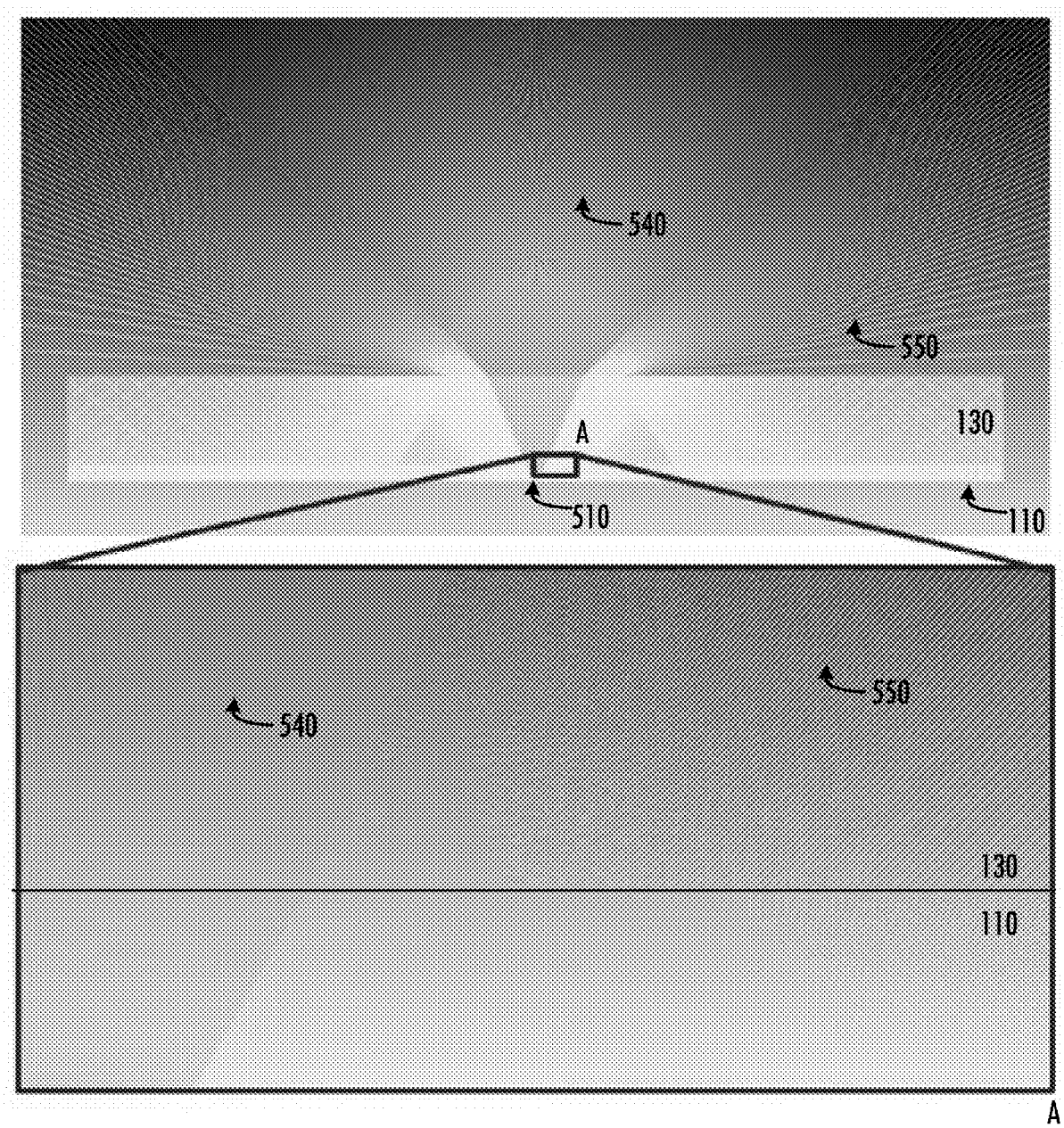
FIGS. 5A and 5B are simulated views that illustrate the operation of a semiconductor light emitting device according to embodiments of the present invention as compared to a conventional device.
Figure 5B:
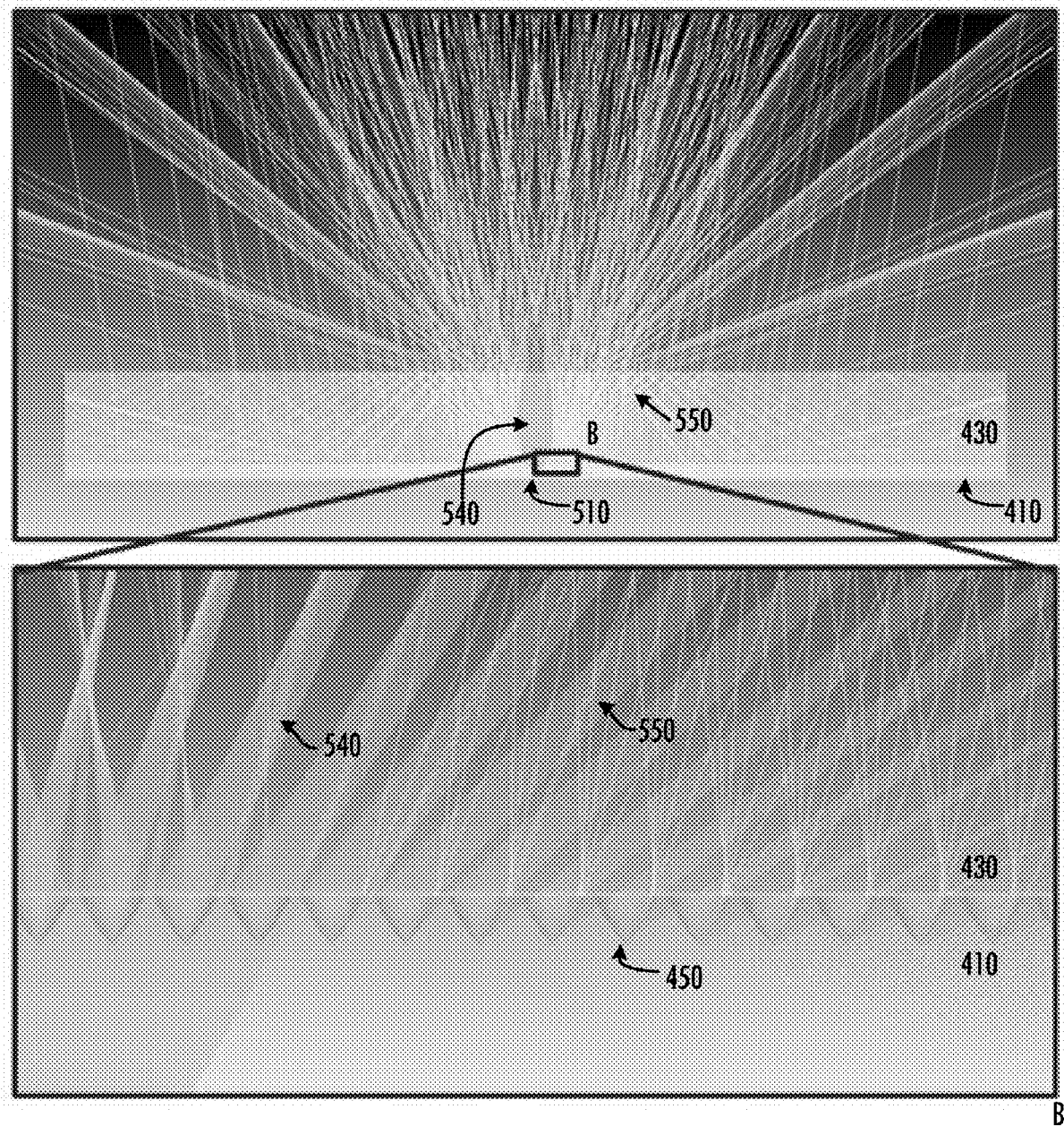
Figure 5C:
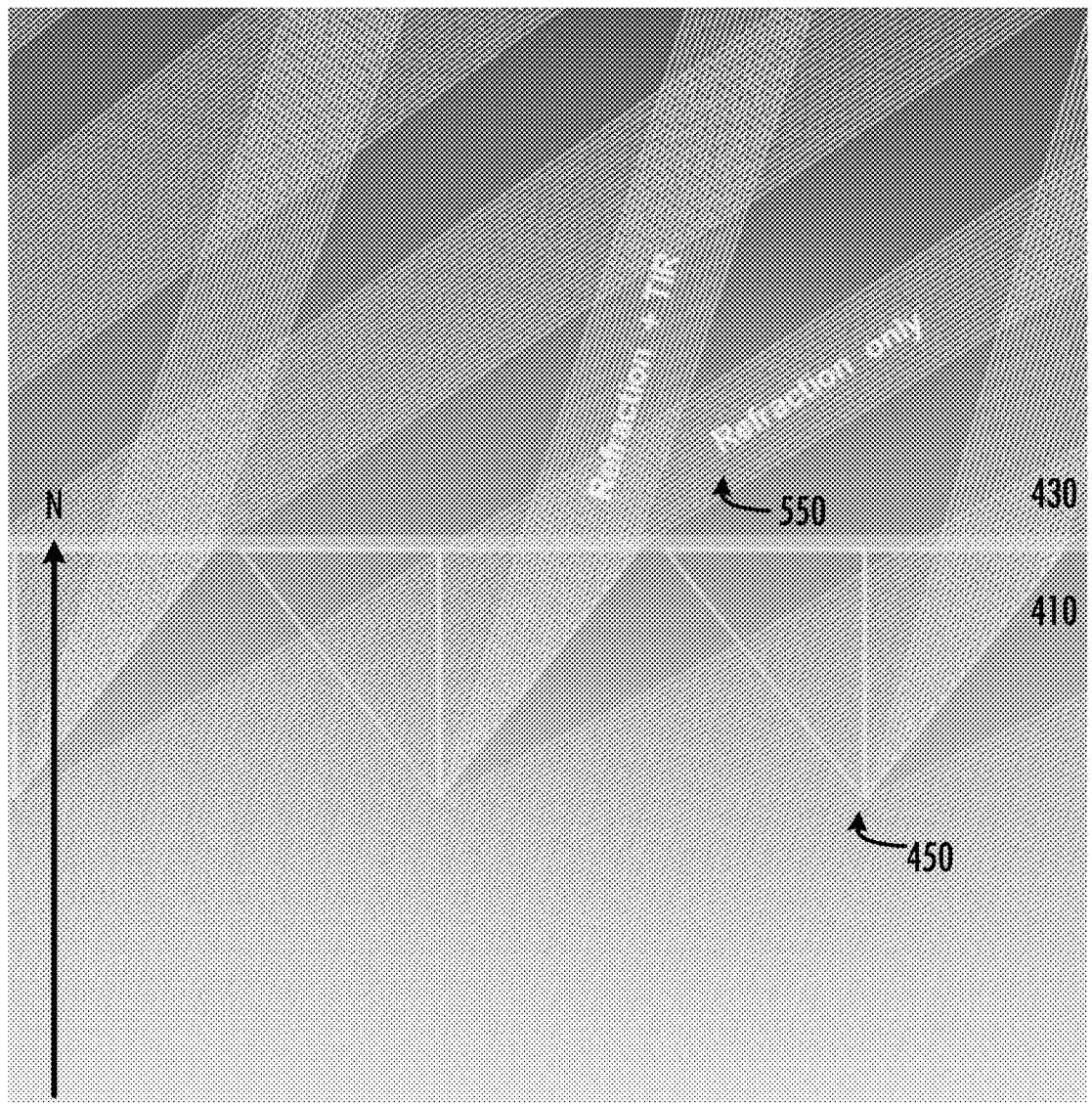
FIGS. 5C and 5D are expanded portions of FIG. 5B.
Figure 5D:
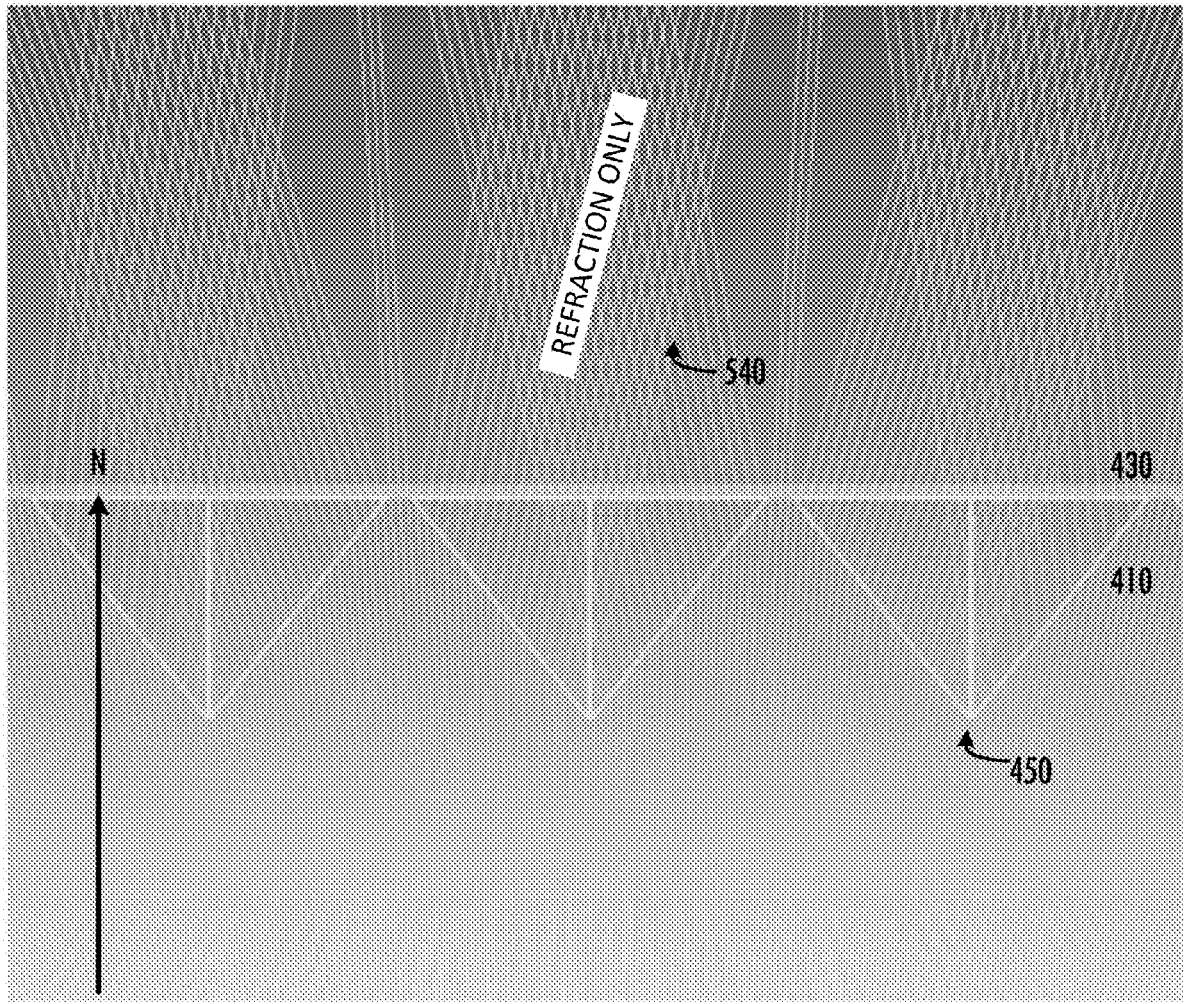

FIGS. 5A and 5B are simulated views that illustrate the operation of a semiconductor light emitting device according to embodiments of the present invention as compared to a conventional semiconductor light emitting device. FIGS. 5C and 5D are expanded portions of FIG. 5B. Referring to FIGS. 5A and 5B, the simulations include blue and yellow regions/lines. The blue regions/lines (an example of which is illustrated in FIG. 5A using reference number 540) represent light that is emitted at relatively small angles from an axis that is normal to the light emitting surface of an underlying LED (e.g., the first component of the emitted light 120a of FIG. 3A), while the yellow regions/lines (an example of which is illustrated in FIG. 5A using reference number 550) represent light that emits at relatively larger angles from the axis that is normal to the light emitting surface of the underlying LED (e.g., the second component of the emitted light 120b of FIG. 3A). FIGS. 5A and 5B schematically illustrate the light emitted from an individual emission point of the LED. In other words, FIGS. 5A and 5B do not necessarily represent all of the light emitted across an entire surface of the underlying LED (not shown), but instead focus on a particular emission point 510. It will be understood that the LED has a plurality of emitting points across the surface of the LED, of which emission point 510 is but one. The phenomenon that is schematically illustrated in FIGS. 5A and 5B may be repeated across multiple points on the surface of the LED.

FIG. 5A illustrates the light emission from a conventional semiconductor light emitting device. The lower portion of FIG. 5A illustrates an exploded view of the section 'A' of the upper portion of FIG. 5A. As illustrated in FIG. 5A, the light of the emission point 510 that emits at angles close to the optical axis that is normal to the light emitting surface of the LED (e.g., the light designated by the blue regions/lines 540) is primarily directed outward along central viewing angles (e.g., from about −45° to about 45°) from the optical axis of the semiconductor light emitting device. As is further illustrated in FIG. 5A, the light of the emission point 510 that emits at larger angles from the axis that is normal to the light emitting surface of the LED (e.g., the light designated using yellow regions/lines 550) is reflected at the interface between the recipient luminophoric medium 110 and the conventional superstrate 130. This higher angle light is concentrated within the wider viewing angles (e.g., from a first section between about −45° to −90° to a second section between about 45° to 90°) from the optical axis of the semiconductor light emitting device. As can be seen from FIG. 5A, while there is internal reflection of the emitted light within the conventional superstrate 130, the reflection is primarily of the higher angle light (e.g., light designated using yellow regions/lines 550). In the lower part of FIG. 5A, a slight bending and/or refraction of the light rays is evident at the boundary between the luminophoric medium 110 and the conventional superstrate 130. This refraction is due to a difference in the index of refraction between the two layers. For the case shown in FIG. 5A, the luminophoric layer 110 has a lower index of refraction (e.g., 1.41) relative to that of the conventional superstrate (e.g., 1.8).

FIG. 5B illustrates the light emission from a semiconductor light emitting device according certain embodiments of the present invention. The lower portion of FIG. 5B illustrates an exploded view of the section 'B' of the upper portion of FIG. 5B. As illustrated in FIG. 5B, the light of the emission point 510 that emits at small angles from the axis that is normal to the light emitting surface of the LED (e.g., the light designated by the blue regions/lines 540) is directed outward along a plurality of viewing angles (e.g., from about −70° to about 70°) from the optical axis of the semiconductor light emitting device. The light of the emission point 510 that emits at larger angles from the axis that is normal to the light emitting surface of the LED (e.g., the light designated using yellow regions/lines 550) is also distributed across a wider viewing angle (e.g., from about −90° to about 90°) from the optical axis of the semiconductor light emitting device. As illustrated in FIG. 5B, there is internal reflection of the emitted light within the patterned superstrate 430 for the higher angle light (e.g., light designated using yellow regions/lines 550). This combination of effects, that is, the refractive bending of normal angle light (e.g., light designated using blue regions/lines 540) to higher angles along with the internal reflection of higher angle light (e.g., light designated using yellow regions/lines 550) towards the normal counters the conventional CoA non-uniformity by mixing the angular distributions of the normal and higher angle light. Stated differently, the internal reflection of the light within the patterned superstrate 430 allows the distribution of the light exiting the patterned superstrate 430 to be more consistent across a wider angle of viewing angles than in the conventional case (e.g., FIG. 5A).

The increased reflection within the patterned superstrate 430 is at least partially due to the optical elements 450. The optical elements 450 introduce additional surfaces having an interface with the recipient luminophoric medium 410 such that refraction of the light entering the patterned superstrate 430 is increased. It should be noted that this effect is more than just a random scattering (e.g., isotropic scattering) of the light that might be performed by other materials, such as with a diffuser. Rather, the interface between the patterned superstrate 430 and the recipient luminophoric medium 410 presents a non-random, distributed interface with materials having different indexes of refraction. The increased surface area of this index of refraction differential provide more opportunities for refraction of the light passing out of the recipient luminophoric medium 410 into the patterned superstrate 430 than in the conventional case. This additional refracted light may then be reflected within the patterned superstrate 430 (e.g., via total internal reflection), leading to an increased distribution of the emitted light.

Thus, variables which can improve and/or affect the CoA variation of the device include both the material used for the patterned superstrate 430 as well as the configuration of the optical elements 450. For example, the material of the patterned superstrate 430 may contribute to a difference in the indexes of refraction between the patterned superstrate 430 and the recipient luminophoric medium 410. The greater the difference between the index of refraction of the patterned superstrate 430 and the index of refraction of the recipient luminophoric medium 410, the greater the amount of refraction, which may increase the amount of light that may be redirected in a manner that may improve the CoA performance of the semiconductor light emitting device. While the embodiments described primarily encompass the case where the index of refraction of the luminophoric recipient medium 410 is lower than that of the patterned superstrate 430, it is understood that in some embodiments the difference may be reversed such that the luminophoric recipient medium 410 has a higher index of refraction than the patterned superstrate 430. In some embodiments, intermediate layers or coatings having a further different index of refraction or even gradations of index of refraction may be present.

In some embodiments, the refraction may lead to total internal reflection of portions of the light. In some embodiments reflection may be increased for light that emits at relatively larger angles from the axis that is normal to the light emitting surface of the underlying LED. For example, light which contacts an optical element 450 such as the one illustrated in FIG. 4 may be altered two times. First, the light may strike a first surface of the optical element 450 and be refracted due to the difference between the index of refraction of the patterned superstrate 430 and the index of refraction of the recipient luminophoric medium 410. Second, the light may continue to travel through the optical element 450 and be altered again when striking the opposite side (e.g., an opposing sidewall) of the optical element 450. The opposite side of the optical element 450 may reflect the light back within the patterned superstrate 430, and this light may be further reflected by other features of the semiconductor light emitting device before ultimately exiting the device through the patterned superstrate 430. The net result may be light that has a more uniform color point is emitted from the device across a wide range of viewing angles. By adjusting the configuration of the optical elements 450 and the material used in the patterned superstrate 430, the index of refraction differential may be tuned so as to enhance the distribution of the light within the patterned superstrate 430. In some embodiments, a difference between the index of refraction of the patterned superstrate 430 and the index of refraction of the recipient luminophoric medium 410 may be at least about 0.3, though the present disclosure is not limited thereto. In some embodiments, the difference between the index of refraction of the patterned superstrate 430 and the index of refraction of the recipient luminophoric medium 410 may be between 0.1 and 2. In some embodiments, the difference between the index of refraction of the patterned superstrate 430 and the index of refraction of the recipient luminophoric medium 410 may be between 0.01 and 0.5.

In addition to the material of the patterned superstrate 430, placement and configuration of the optical elements 450 may also play a role in the type of light that exits the semiconductor light emitting device at different viewing angles. For example, the shape of the optical elements 450 can affect the surfaces offered to light emitted through the recipient luminophoric medium 410. As will be described further herein, the shape of the optical elements 450 can be selected to adjust the distribution of the light emitted by the semiconductor light emitting device. In addition, the arrangement (e.g., the pitch) of the optical elements 450 may also contribute to the variances of the surfaces offered to light emitted through the recipient luminophoric medium 410. Therefore, a pitch of the optical elements 450 may also be selected to adjust the distribution of the light emitted by the semiconductor light emitting device.

FIGS. 5C and 5D are expanded portions of FIG. 5B. FIG. 5C shows various simulations of paths that higher angle light (e.g., the light designated as "yellow" in the FIG. 550) may travel when encountering an optical element 450. FIG. 5D shows similar simulations of paths for smaller angle light (e.g., light designated as "blue" in the FIG. 540). Within FIGS. 5C and 5D, the optical axis N of the semiconductor light emitting device is illustrated for orientation purposes. Referring to FIG. 5C, the higher angle light may contact an optical element 450 as it exits the recipient luminophoric medium 410. Because of the difference in index of refraction between the recipient luminophoric medium 410 and the material of the optical element 450, refraction may occur. In some cases, the refraction of the light may alter a direction of travel of the light such that it contacts an opposite sidewall of the optical element 450. When this happens, total internal reflection (TIR) may occur, which may cause the light to reflect back toward the top surface of the patterned superstrate 430. An example of light traveling this path is marked as "Refraction+TIR" in FIG. 5C. In some cases, the direction of travel of the light may be altered (e.g., refracted) but the alteration may not be enough to cause the light to strike the opposite sidewall of the optical element 450. In this case, the light may be refracted towards the top surface of the patterned superstrate 430 at a shallower angle than the light that is reflected off of an opposite sidewall of the optical element 450. An example of light traveling this path is marked as "Refraction Only" in FIG. 5C. In some embodiments, the optical elements 450 may redirect a portion of light emitted from the LED that is at least 45° from the optical axis N to within 30° from the optical axis N. In some embodiments, the optical elements 450 may redirect a portion of light emitted from the LED that is at least 10° from the optical axis N to more than 30° from the optical axis N.

Referring to FIG. 5D, the smaller angle light (e.g., light with an angle closer to perpendicular with respect to the emitting surface of the LED) may contact an optical element 450 as it exits the recipient luminophoric medium 410. This light may contact the optical element 450 at a "steeper" angle as compared to the higher angle light discussed above with reference to FIG. 5C. As discussed previously, the difference in index of refraction between the recipient luminophoric medium 410 and the material of the optical element 450 may cause the smaller angle light to refract as the light contacts the first surface of the optical element 450. However, because of the steeper angle of the smaller angle light, the refraction may not be as great as with the higher angle light illustrated in FIG. 5C, and hence less (or none) of the smaller angle light may strike an opposing sidewall of the optical element 450. Accordingly, the light may be refracted towards the top surface of the patterned superstrate 430, albeit at an increased angle with respect to the optical axis N. An example of light traveling this path is marked as "Refraction Only" in FIG. 5D.

As noted previously, the "yellow" (550) and "blue" (540) designations of the light rays in FIGS. 5A-D are not intended to represent color, but instead represent the angle of the light that is emitted from the combination of the LED chip 100 and the recipient luminophoric medium 110, 410. Light emitting at a higher angle from the optical axis N will travel farther through the recipient luminophoric medium 110, 410 and, therefore, have a proportionally higher component of light that has been converted to different wavelengths within the recipient luminophoric medium 110, 410. Similarly, light emitting at smaller angles with respect to the optical axis N will have a proportionally lesser component of light that has been converted to different wavelengths within the recipient luminophoric medium 110, 410. By distributing both types of light across a wider range of viewing angles, a more consistent CoA can be achieved.

Figure 6A:
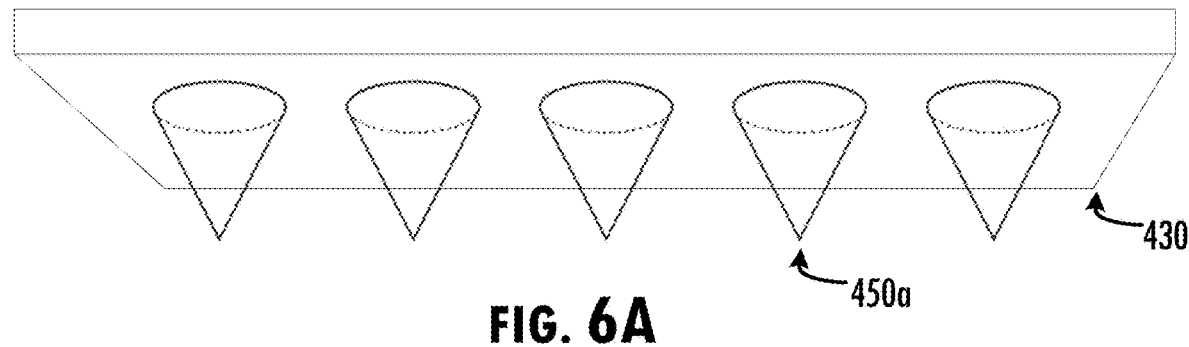
FIGS. 6A, 6B, 6C, 7A, 7B, 7C, 8A, 8B, and 8C are schematic cross-sectional views of example configurations of optical elements included in a semiconductor light emitting device according to certain embodiments of the present invention.
Figure 6B:
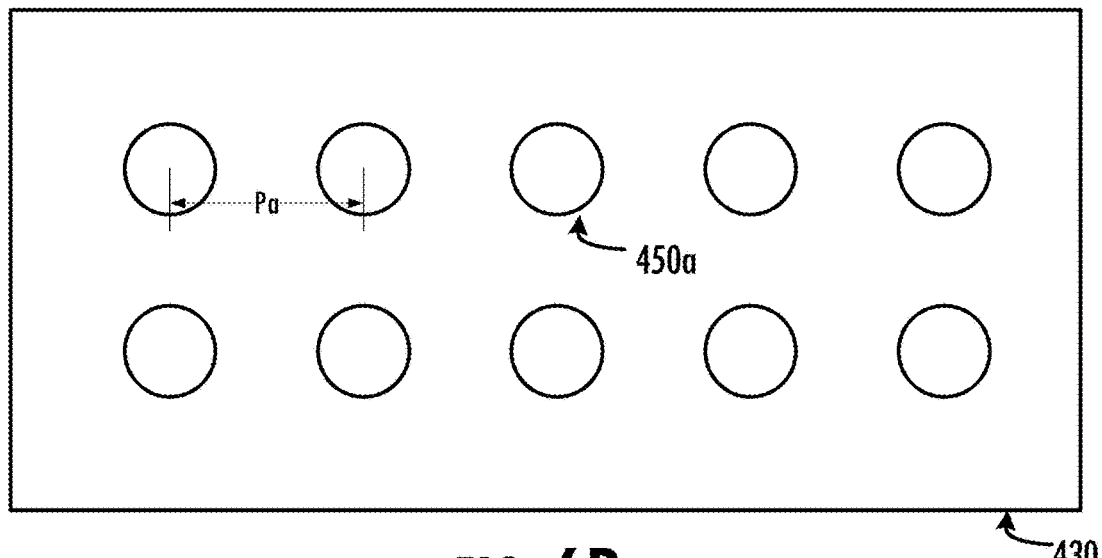
Figure 6C:
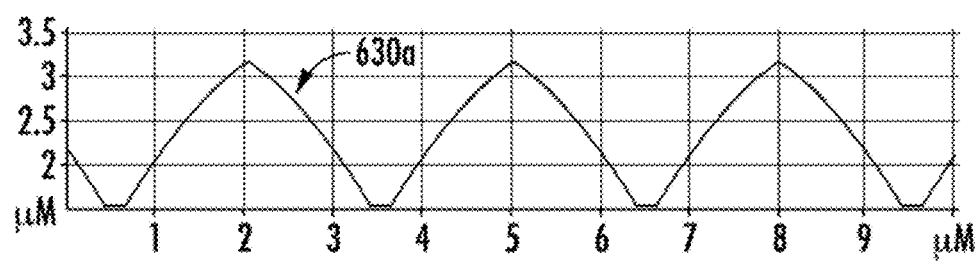

FIGS. 6A, 6B, and 6C illustrate example configurations of optical elements 450a according to embodiments of the present invention. As illustrated in FIG. 6A, the optical elements 450a may have a substantially conical shape. The conical optical elements 450a may protrude from the patterned superstrate 430. In other words, the patterned superstrate 430 may be formed by patterning a superstrate to have the conical optical elements 450a protruding therefrom. In some embodiments, the optical elements 450a may be formed via an etching process (e.g., wet or dry etching) so as to form the protrusions illustrated in FIG. 6A. FIG. 6B illustrates a plan view of an arrangement of the conical optical elements 450a on the patterned superstrate 430. Respective ones of the conical optical elements 450a may be separated from adjacent ones of the conical optical elements 450a by a pitch Pa in some embodiments. Though the conical optical elements 450a illustrated in FIG. 6A include linear sidewalls, embodiments of the present invention are not limited thereto. For example, in some embodiments sidewalls of the optical elements 450, including the conical optical elements 450a, may include curved and/or non-linear sidewalls 630a, as illustrated in the profile diagram of FIG. 6C. In some embodiments, a height of the conical optical element 450a may be from about 1 μm to about 2 μm. A diameter of the base of the conical optical element 450a may be from about 2.2 µm to about 3 µm. The pitch Pa may be between about 2 µm to about 4 µm. In other embodiments, a height of the conical optical element 450a may be from about 0.5 µm to about 4 µm, a diameter of the base of the conical optical element 450a may be from about 1.0 µm to about 4 µm, and the pitch Pa may be between about 1.5 µm to about 8 µm. In some embodiments, the pitch Pa may vary from between 0.5 µm to about 10 µm. In some embodiments, the pitch Pa may be based on a dimension of the conical optical element 450a. For example, in some embodiments, the pitch Pa may be between 0.5 to 10 times a dimension (e.g., a width) of the conical optical element 450a.

Figure 7A:
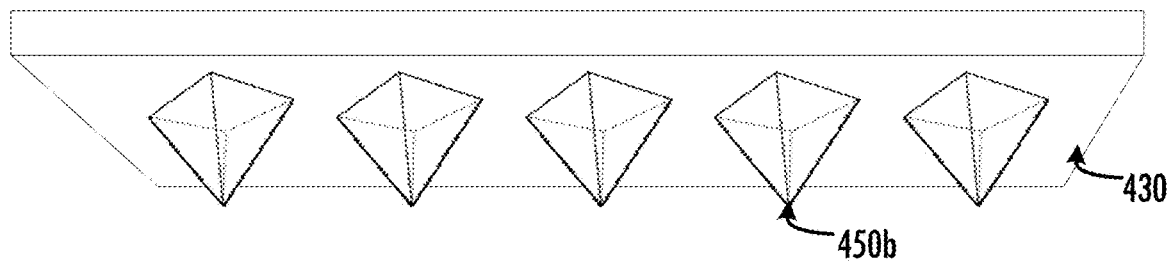
Figure 7B:
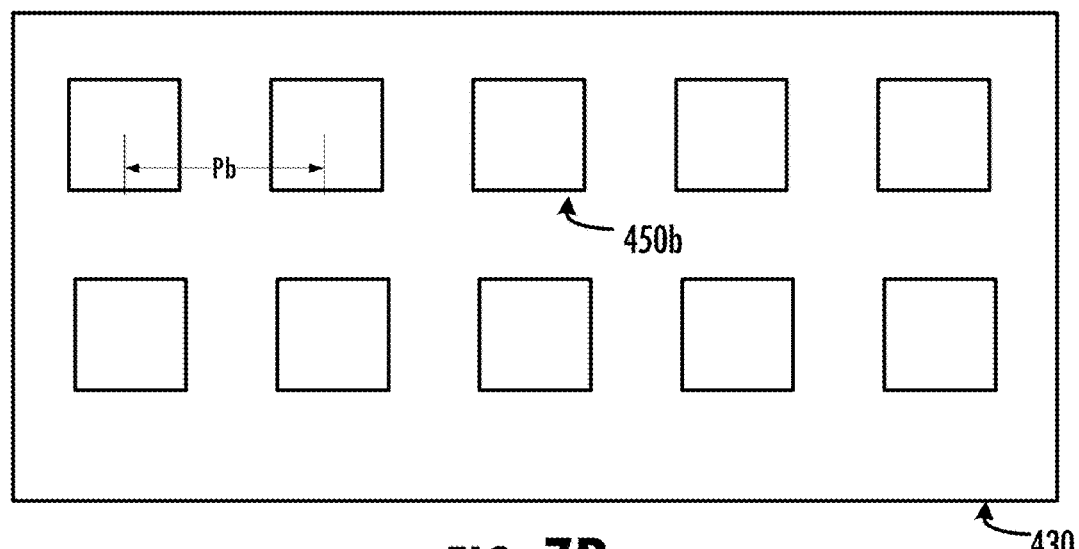
Figure 7C:
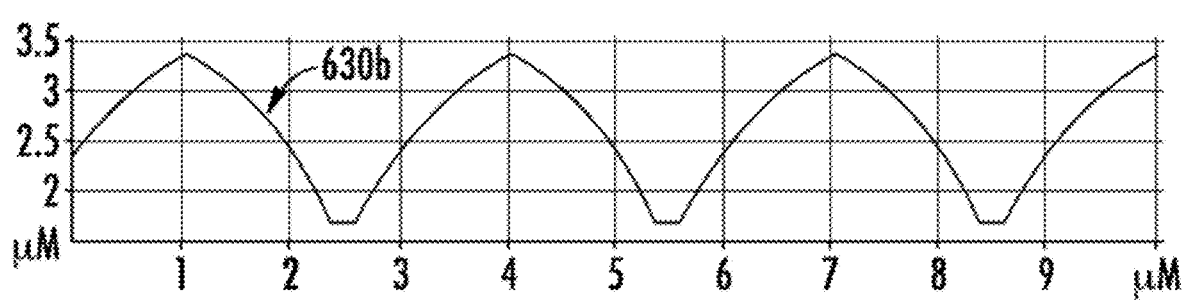

FIGS. 7A, 7B, and 7C illustrate additional example configurations of optical elements 450b according to embodiments of the present invention. As illustrated in FIG. 7A, the optical elements 450b may be configured in a substantially quadrilateral pyramid shape. The quadrilateral pyramid optical elements 450b may be configured to protrude from the patterned superstrate 430. A base of the quadrilateral pyramid optical elements 450b may have, for example, a quadrilateral design with four sides. FIG. 7B illustrates a plan view of an arrangement of the quadrilateral pyramid optical elements 450b on the patterned superstrate 430. Respective ones of the quadrilateral pyramid optical elements 450b may be separated from adjacent ones of the quadrilateral pyramid optical elements 450b by a pitch Pb. As discussed with respect to FIG. 6C, the sidewalls 630b of the quadrilateral pyramid optical elements 450b may be curved and/or non-linear, as illustrated in the profile diagram FIG. 7C. The curve of the sidewall 630b may be the same or different than the curve of the sidewall 630a illustrated in FIG. 6C. In some embodiments, a height of the quadrilateral pyramid optical element 450b may be from about 1 µm to about 2 µm. A dimension (e.g. a length or a width) of a side of the base of the quadrilateral pyramid optical element 450b may be from about 2.2 µm to about 3 µm. The pitch Pb may be between about 2 µm to about 4 µm. In other embodiments, a height of the quadrilateral pyramid optical element 450a may be from about 0.5 µm to about 4 µm, a diameter of the base of the quadrilateral pyramid optical element 450a may be from about 1.0 µm to about 4 µm, and the pitch Pb may be between about 1.5 µm to about 8 µm. In some embodiments, the pitch Pb may vary from between 0.5 µm to about 10 µm. In some embodiments, the pitch Pb may be based on a dimension of the quadrilateral pyramid optical element 450b. For example, in some embodiments, the pitch Pb may be between 0.5 to 10 times a dimension (e.g., a width) of the quadrilateral pyramid optical element 450b.

Figure 8A:
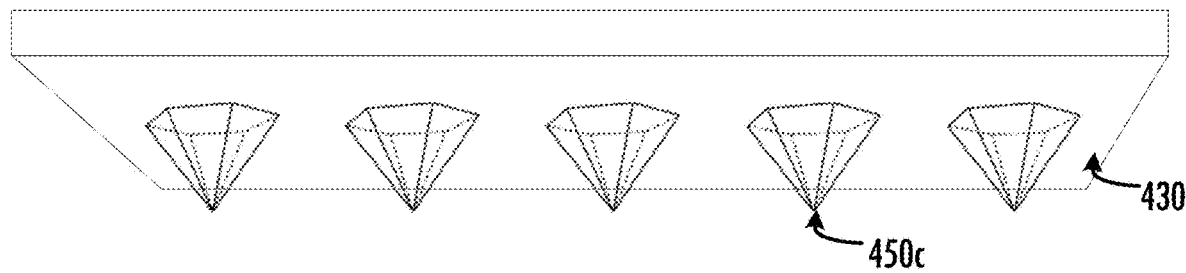
Figure 8B:
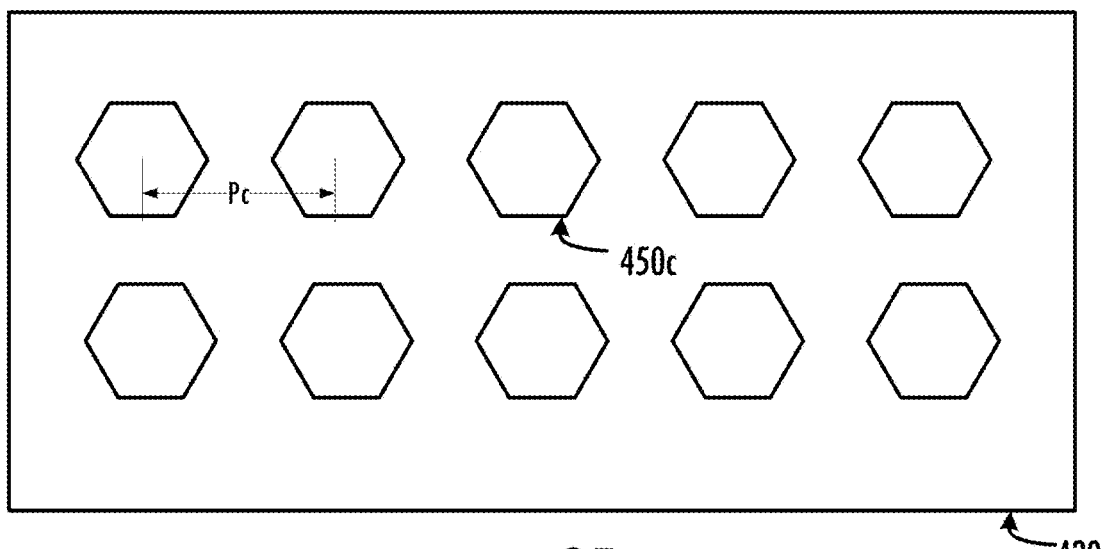
Figure 8C:
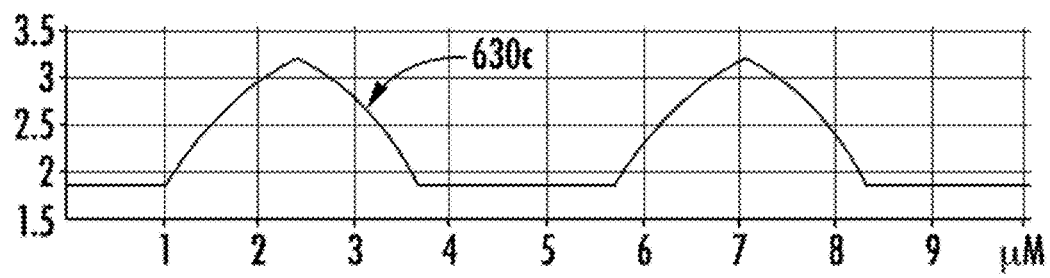

FIGS. 8A, 8B, and 8C illustrate additional example configurations of optical elements 450c according to embodiments of the present invention. As illustrated in FIG. 8A, the optical elements 450c may be configured in a substantially hexagonal pyramid shape. The hexagonal pyramid optical elements 450c may be configured to protrude from the patterned superstrate 430. A base of the hexagonal pyramid optical elements 450c may have, for example, a hexagonal design with six sides. FIG. 8B illustrates a plan view of an arrangement of the hexagonal pyramid optical elements 450c on the patterned superstrate 430. Respective ones of the hexagonal pyramid optical elements 450c may be separated from adjacent ones of the hexagonal pyramid optical elements 450c by a pitch Pc. As discussed with respect to FIG. 6C, sidewalls 630c of the hexagonal pyramid optical elements 450c may be curved and/or non-linear, as illustrated in the profile view of FIG. 8C. The curve of the sidewall 630c may be the same as or different than the curve of the sidewall 630a illustrated in FIG. 6C and/or the curve of the sidewall 630b illustrated in FIG. 7C. In some embodiments, a height of the hexagonal pyramid optical element 450c may be from about 1 µm to about 1.5 µm. A widest dimension of the base of the hexagonal pyramid optical element 450c may be from about 1.8 µm to about 2.7 The pitch Pc may be between about 2.4 µm to about 2.8 µm. In other embodiments, a height of the hexagonal pyramid optical element 450a may be from about 0.5 µm to about 3 µm, a diameter of the base of the hexagonal pyramid optical element 450a may be from about 1.0 µm to about 4 µm, and the pitch Pc may be between about 1.5 µm to about 5 µm. In some embodiments, the pitch Pc may vary from between 0.5 µm to about 10 µm. In some embodiments, the pitch Pc may be based on a dimension of the hexagonal pyramid optical element 450c. For example, in some embodiments, the pitch Pc may be between 0.5 to 10 times a dimension (e.g., a width) of the hexagonal pyramid optical element 450c.

Though specific shapes have been described with respect to FIGS. 6A-8C, it will be understood that other shapes may be provided for the optical elements 450 to provide further embodiments of the present invention. For example, the optical elements 450 may be other types of geometric shapes, including pyramids having bases with different numbers of sides, spheres, spheroids, cubes, cylinders, paraboloids, etc. Similarly, the various optical elements 450 may be arranged on the patterned superstrate 430 in various ways. For example, the optical elements 450 may be arranged in grids of various configurations (e.g., square, rectangle, hexagonal, etc.). In addition, the optical elements 450 may be arranged on the patterned superstrate in irregular and/or non-periodic arrangements (e.g., randomly patterned, quasicrystals, etc.). In some embodiments, the optical elements 450 may be arranged in a first arrangement at a first location (e.g., an edge or a middle) of the patterned superstrate 430 and in a second arrangement at a second location (e.g., an edge or a middle) of the patterned superstrate 430. For example, a first location of the patterned superstrate 430 may include optical elements 450 arranged in a regular grid and a second location of the patterned superstrate 430 may include optical elements 450 arranged randomly. In some embodiments, a first location of the patterned superstate 430 may include optical elements 450 arranged in a grid having a first configuration (e.g., square) and a second location of the patterned superstrate 430 may include optical elements 450 arranged in a grid having a second configuration (e.g., hexagonal). In some embodiments, the optical elements 450 on the patterned superstrate 430 may be composed of multiple shapes and sizes. For example, a first type and/or shape of optical element 450 (e.g., a conical optical element 450a of FIGS. 6A-C) may be used in a first part of the patterned superstrate 430 and a second type and/or shape of optical element 450 (e.g., a hexagonal pyramid optical element 450c of FIGS. 8A-C) may be used in a second part of the patterned superstrate 430. In some embodiments, the pitch between adjacent ones of the optical elements 450 may be between 0.5 to 10 times a dimension (e.g., a width) of the optical element 450.

Figure 9A:
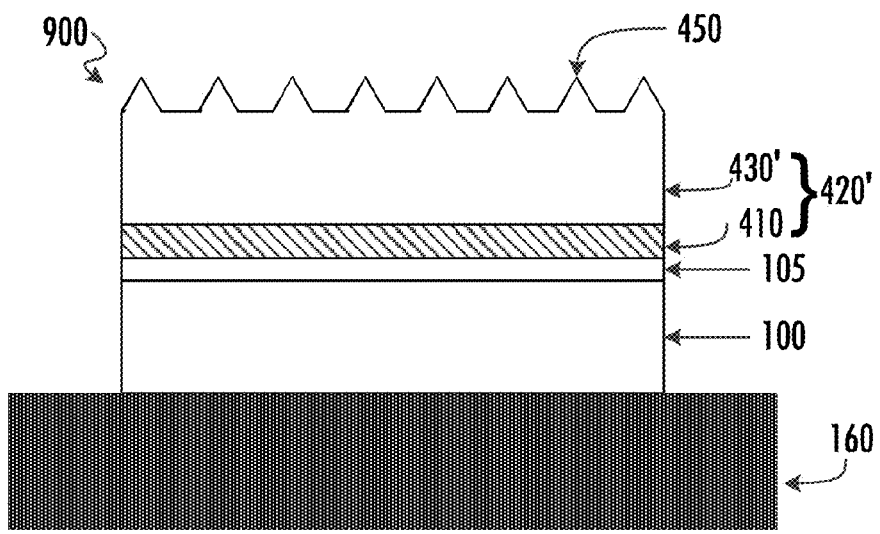
FIG. 9A is a schematic cross-sectional view of a semiconductor light emitting device according to embodiments of the present invention in which the optical elements are on a top surface of a patterned superstrate.

Though FIG. 4 illustrates an example in which the optical elements 450 are on a bottom surface of the patterned superstrate 430 (e.g., the surface of the patterned superstrate 430 closest to the LED chip 100), it will be understood that other configurations are possible. For example, FIG. 9A illustrates a semiconductor light emitting device 900 according to embodiments of the present invention in which the optical elements 450 are on a top surface of a patterned superstrate 430'. As illustrated in FIG. 9A, a bottom surface of the patterned superstrate 430' may be adjacent the recipient luminophoric medium 410 and the optical elements 450 may be placed on an opposite side (e.g., a top surface) of the patterned superstrate 430' from the recipient luminophoric medium 410. As with the lighting device 400 of FIG. 4, the patterned superstrate 430' and the recipient luminophoric medium 410 may together comprise a chip cover 420', but the present invention is not limited thereto. In some embodiments, the patterned superstrate 430' may be placed on the LED chip 100 separately from the recipient luminophoric medium 410. In such embodiments, the transparent adhesive layer 105 may not be needed.

Figure 9B:
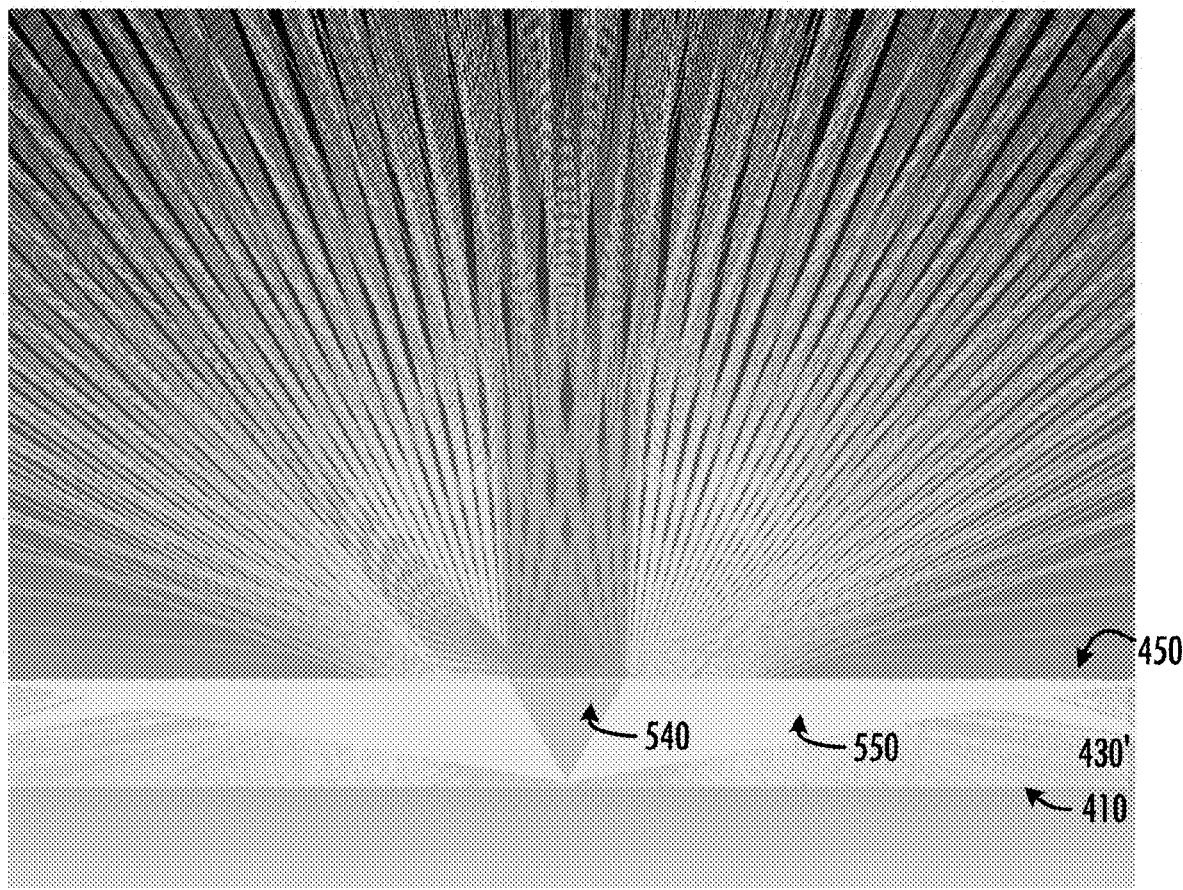
FIG. 9B is a schematic view illustrating the operation of the semiconductor light emitting device of FIG. 9A.

FIG. 9B is a schematic view illustrating the operation of the semiconductor light emitting device 900 of FIG. 9A. FIG. 9B includes a similar designation of light rays of a point source illustrated as blue (540) or yellow (550) based on an angle of emission from the LED, as illustrated in FIGS. 5A and 5B. That description will not be repeated here for brevity. As illustrated in FIG. 9B, an operation of the semiconductor light emitting device 900 with optical elements 450 on a top surface of the patterned superstrate 430' differs from that of a semiconductor light emitting device with optical elements 450 on a bottom surface of the patterned superstrate 430' (e.g., semiconductor light emitting device 400 of FIG. 4). However, the variation of the index of refraction of the materials between the patterned superstrate 430' and the recipient luminophoric medium 410 still results in increased reflection within the patterned superstrate 430'. As a result, a CoA variation of the semiconductor light emitting device 900 is altered as compared to conventional devices. In addition, a brightness of light emitted from the semiconductor light emitting device 900 with optical elements 450 on a top surface of the patterned superstrate 430' may be increased as compared to a brightness of other semiconductor light emitting devices.

Figure 10A:
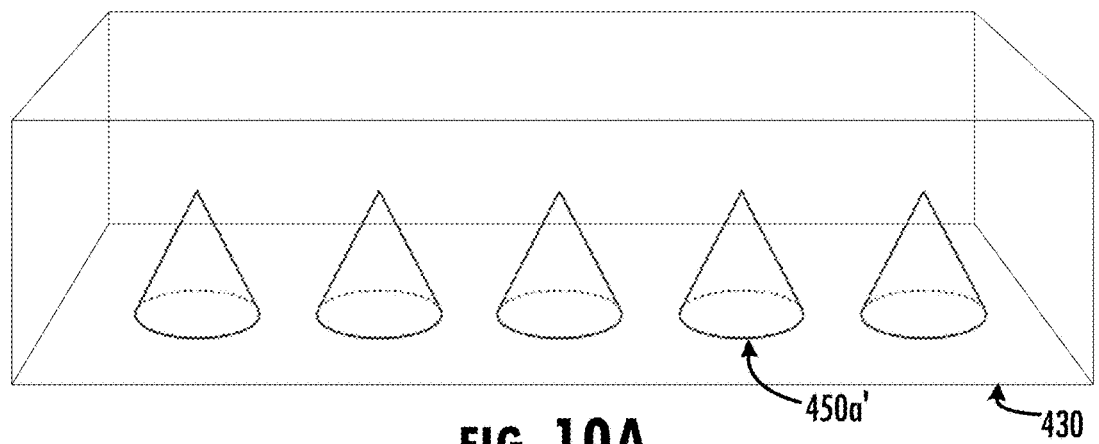
FIGS. 10A, 10B, and 10C illustrate semiconductor light emitting devices similar to those of FIGS. 6A, 7A, and 8A, respectively, in which the optical elements are indented into the surface of the patterned superstrate.
Figure 10B:
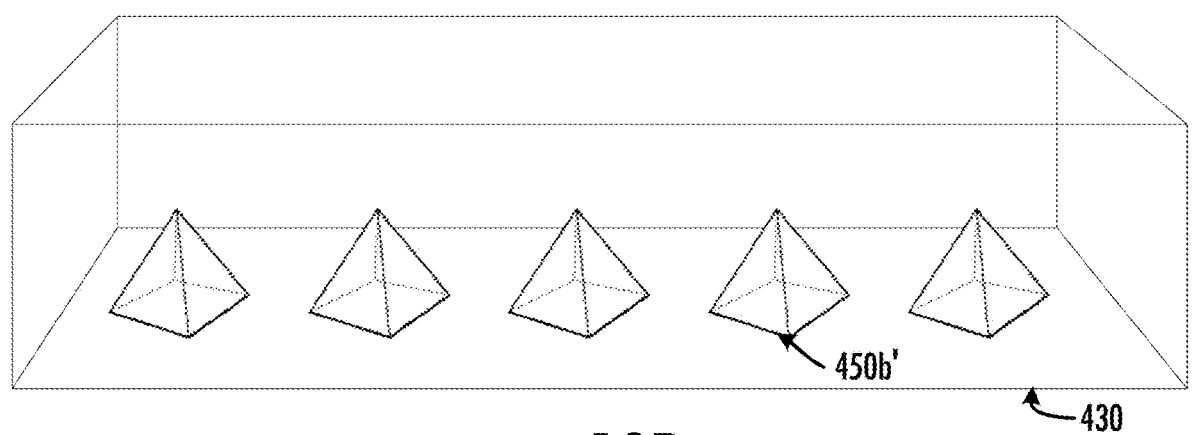
Figure 10C:
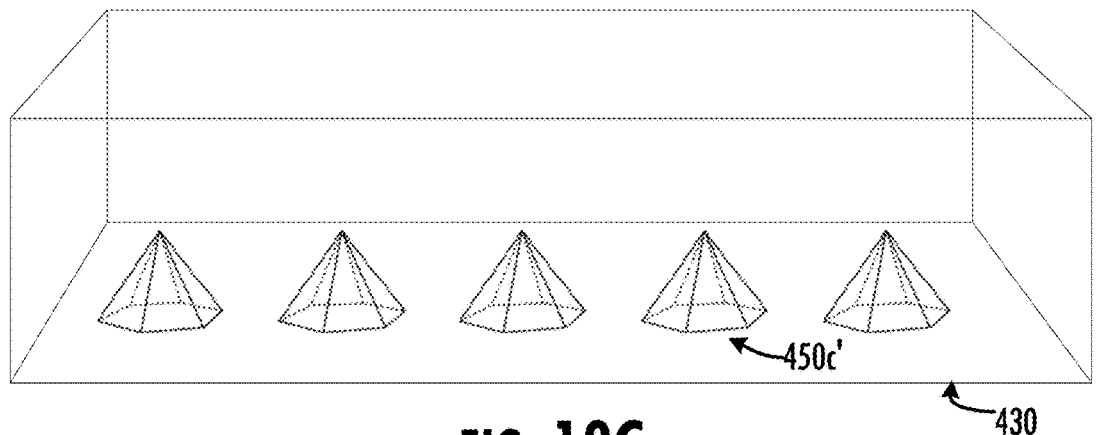

Though the previously described embodiments illustrate optical elements 450 which protrude from a patterned superstrate 430, it will be understood that embodiments of the present invention are not limited thereto. For example, in some embodiments, optical elements 450 may be configured as indentations in the patterned superstrate 430. FIGS. 10A, 10B, and 10C illustrate embodiments of optical elements 450 with shapes similar to those of FIGS. 6A, 7A, and 8A, respectively, except that the optical element 450 are indented into the surface of the patterned superstrate 430 as opposed to protruding therefrom. For example, FIG. 10A illustrates conical optical elements 450a' that are indented into the surface of the patterned superstrate 430. FIG. 10B illustrates quadrilateral pyramid optical elements 450b' that are indented into the surface of the patterned superstrate 430. FIG. 10C illustrates hexagonal pyramid optical elements 450c' that are indented into the surface of the patterned superstrate 430. The indented optical elements 450a', 450b', 450c' may be formed by etching (e.g., via a dry or wet etch) a bulk substrate and then singulating the bulk substrate to form the optical elements 450a', 450b', 450c'.

Figure 11A:
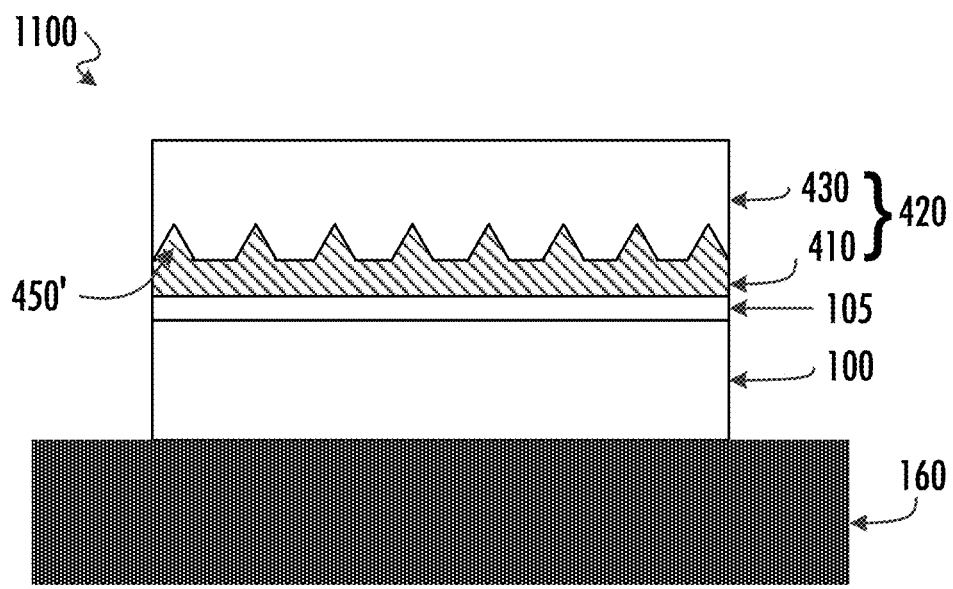
FIGS. 11A and 11B are schematic cross-sectional views of example semiconductor light emitting devices in which indented optical elements are included in the patterned superstrate.
Figure 11B:
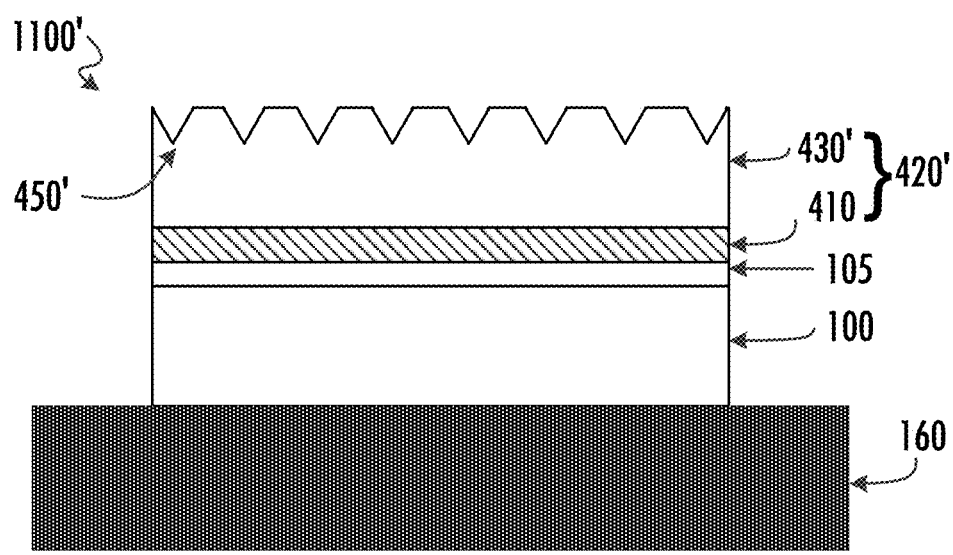

A patterned superstrate 430 including indented optical elements 450 such as those illustrated in FIGS. 10A, 10B, and 10C may be utilized in device configurations such as those illustrated in FIGS. 4 and 9. For example, FIG. 11A illustrates an example semiconductor light emitting device 1100 in which indented optical elements 450' are in a bottom surface of the patterned superstrate 430 in a manner similar to that of FIG. 4. In some embodiments, the recipient luminophoric medium 410 may be within and/or fill the indentations of the indented optical elements 450', but the embodiments described herein are not limited thereto. For example, in some embodiments, the indentation of the indented optical elements 450' may be configured to include a void therein (e.g., with an air gap). FIG. 11B illustrates an example lighting device 1100' in which indented optical elements 450' are in a top surface of the patterned superstrate 430' in a manner similar to that of FIG. 9.

As with the semiconductor light emitting device 400 of FIG. 4, the patterned superstrate 430, 430' and the recipient luminophoric medium 410 of FIGS. 11A and 11B may together form a chip cover 420, 420', but embodiments of the present invention are not limited thereto. In some embodiments, the patterned superstrate 430, 430' may be placed on the LED chip 100 separately from the recipient luminophoric medium 410. In such embodiments, the transparent adhesive layer 105 may not be needed.

Figure 12A:
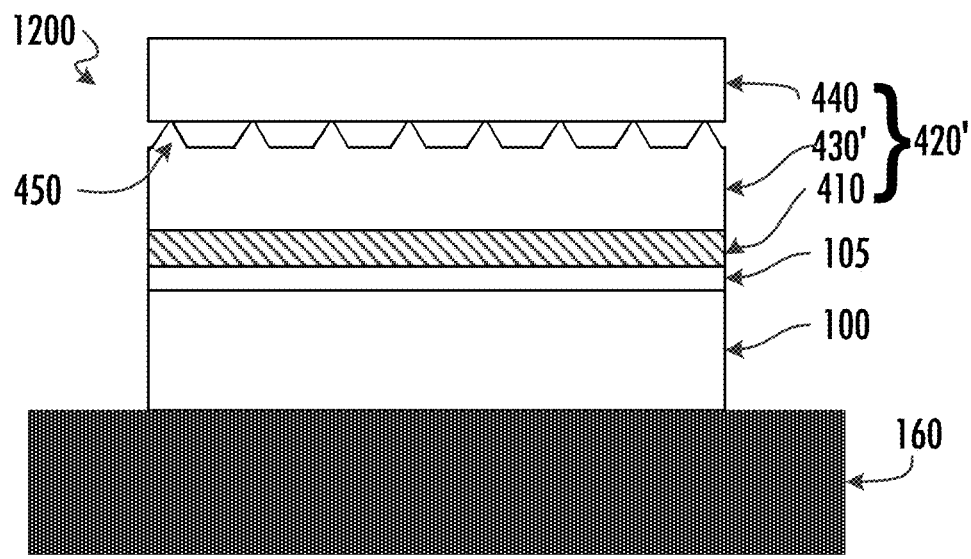
FIGS. 12A and 12B are schematic cross-sectional views of example semiconductor light emitting devices in which the optical elements are provided as protrusions between two superstrates.
Figure 12B:
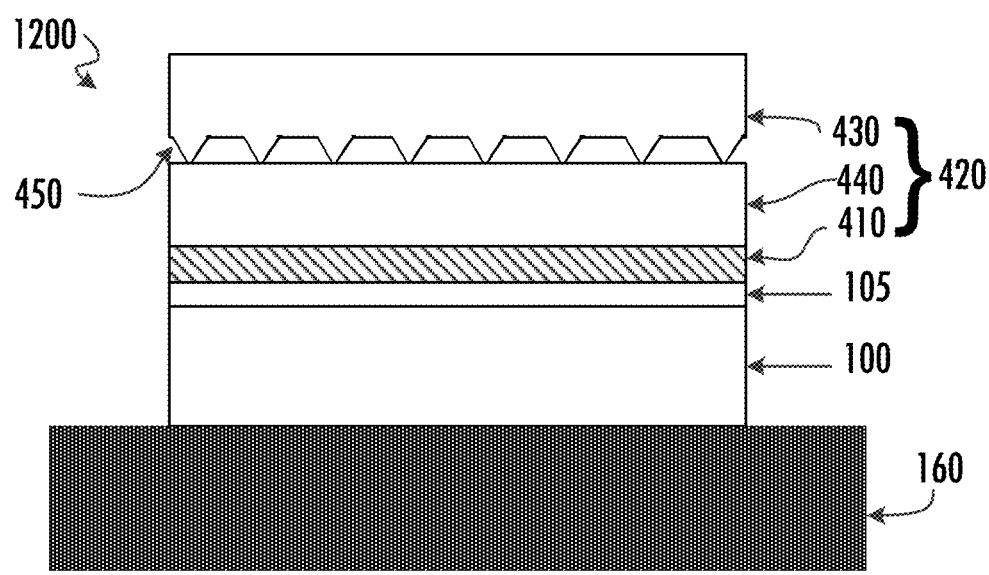

The semiconductor light emitting devices according to embodiments of the present invention may also benefit from the use of two superstrates, at least one of which is a patterned superstrate. By using two superstrates, the optical elements may be spaced apart from the recipient luminophoric medium. This separation may allow for additional reflection of emitted light within the two superstrates, further improving (e.g., reducing) the CoA variation of the semiconductor light emitting device. FIGS. 12A and 12B illustrate example semiconductor light emitting devices 1200 in which the optical elements 450 are provided between two superstrates. Referring to FIG. 12A, the patterned superstrate 430' may be provided on the recipient luminophoric medium 410. The patterned superstrate 430' may be provided with the optical elements 450 arranged on a top surface of the patterned superstrate 430'. The optical elements 450 may be, for example, any of the optical elements 450a, 450b, 450c described herein with respect to FIGS. 6A-8C as well as other shapes. In the semiconductor light emitting device 1200, a second superstrate 440 may be provided on the patterned superstrate 430'. In some embodiments, the patterned superstrate 430' and the second superstrate 440 may be composed of the same material. In some embodiments, the patterned superstrate 430' and the second superstrate 440 may be composed of different materials. By using different materials, the two superstrates may introduce an additional differential between the index of refraction of the patterned superstrate 430' and the index of refraction of second superstrate 440, which may introduce additional beneficial adjustments to the CoA of the semiconductor light emitting device 1200.

Because of the optical elements 450 protruding from the patterned superstrate 430', a gap may be formed between the patterned superstrate 430' and the second superstrate 440. In some embodiments, the gap between the patterned superstrate 430' and the second superstrate 440 may be filled with a transparent filler material, such as an acrylic and/or silicone material. In some embodiments, the gap may be left substantially empty, e.g., as an air gap.

FIG. 12B illustrates the semiconductor light emitting device 1200 in which the second superstrate 440 is placed on the recipient luminophoric medium 410, and the patterned superstrate 430 is placed on the second superstrate 440. In this example, the optical elements 450 protrude from a bottom surface of the patterned superstrate 430 at an interface between the patterned superstrate 430 and the second superstrate 440.

The interface between the patterned superstrate 430' and the second superstrate 440, as illustrated in FIGS. 12A and 12B, may provide additional structures to promote reflection within the patterned superstrate 430' and/or the second superstrate 440. As with the semiconductor light emitting device 400 of FIG. 4, the patterned superstrate 430, 430', the second superstrate 440, and the recipient luminophoric medium 410 of FIGS. 12A and 12B may together form a chip cover 420, 420', but the embodiments described herein are not limited thereto. In some embodiments, the patterned superstrate 430, 430' may be placed on the LED chip 100 separately from the recipient luminophoric medium 410. In such embodiments, the transparent adhesive layer 105 may not be needed.

Figure 12C:
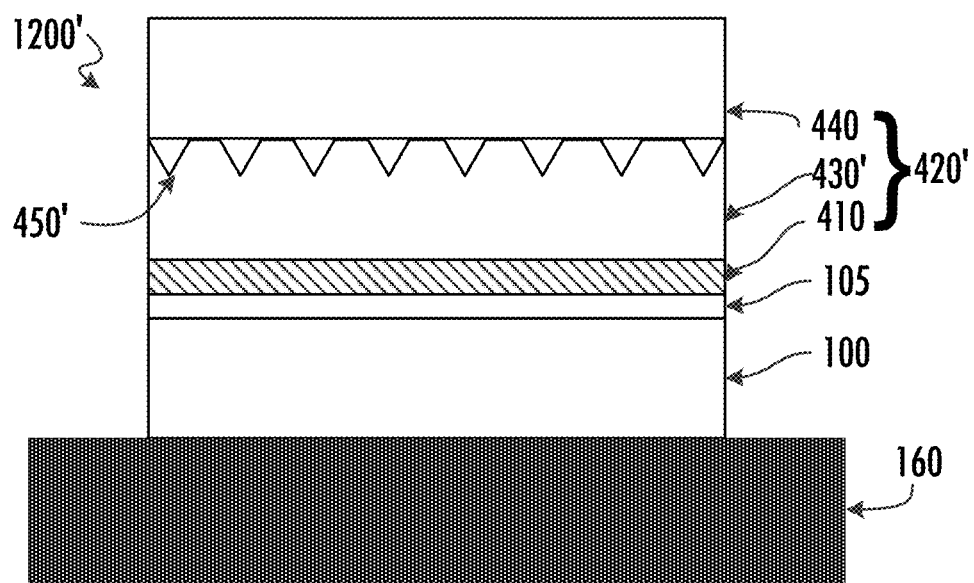
FIGS. 12C and 12D are schematic cross-sectional views of example semiconductor light emitting devices in which the optical elements are provided as indentations between two superstrates.
Figure 12D:
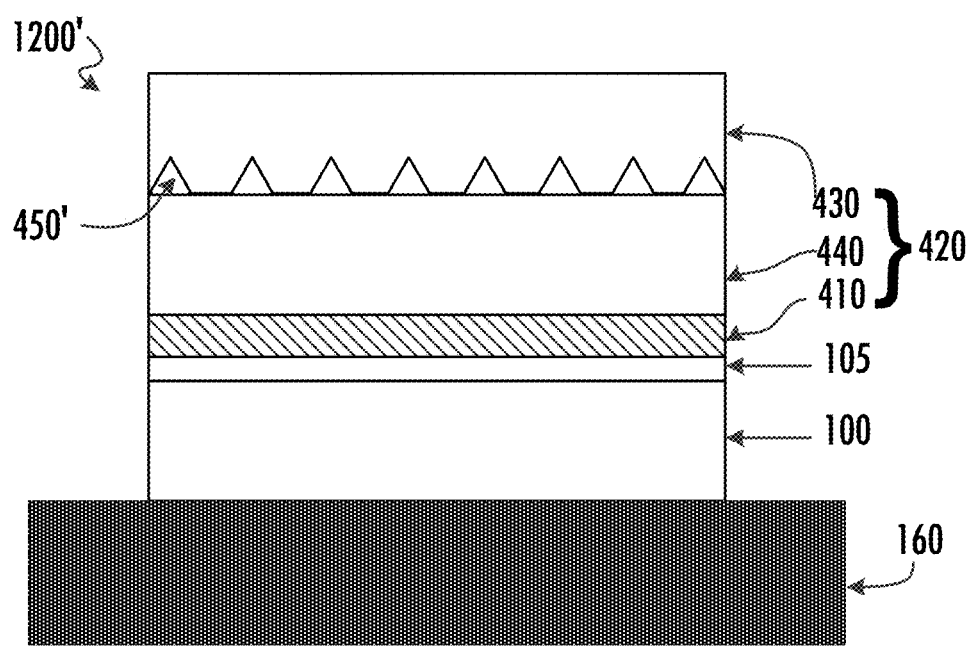

FIGS. 12C and 12D illustrate example semiconductor light emitting devices 1200' in which the optical elements 450' are provided as indentations between two superstrates. The embodiment of FIG. 12C includes a configuration similar to that of FIG. 12A, with the exception that the patterned superstrate 430' includes optical elements 450' that are indentations rather than protrusions. Thus, the second superstrate 440 may be on and, in some embodiments, flush with an upper surface of the patterned superstrate 430'. The embodiment of FIG. 12D includes a configuration similar to that of FIG. 12B, with optical elements 450' positioned in a bottom surface of the patterned superstrate 430. In the embodiments of FIGS. 12C and 12D, the optical elements 450' formed of the indentations of the patterned superstrate 430, 430' may be filled with a material (e.g., an acrylic and/or silicone material) or, in some embodiments, voids/gaps may be left within the optical elements 450'.

Figure 12E:
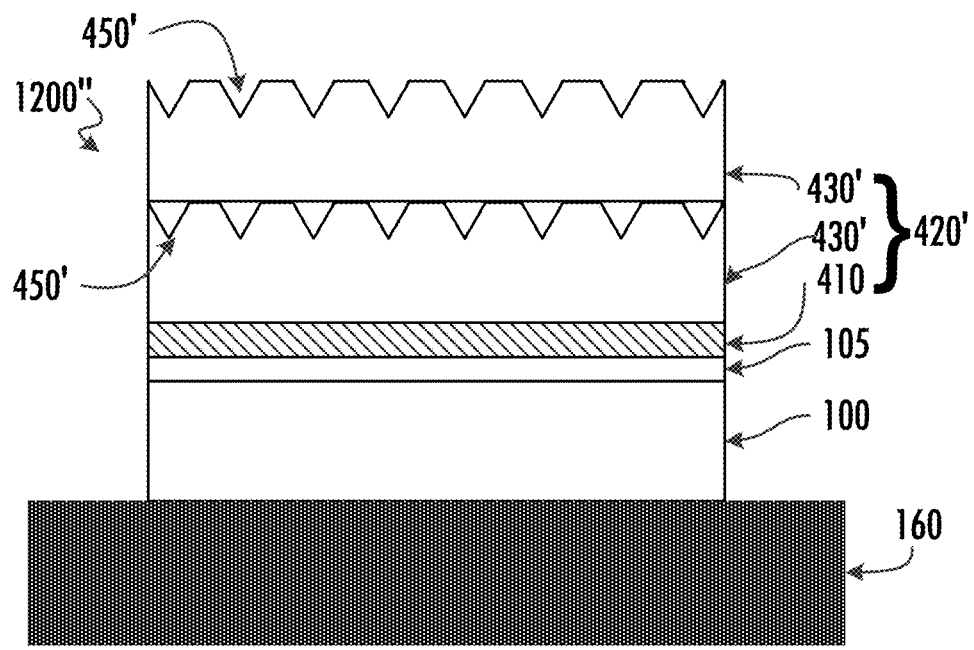
FIGS. 12E and 12F are schematic cross-sectional views of example semiconductor light emitting devices including more than one patterned superstrate.
Figure 12F:
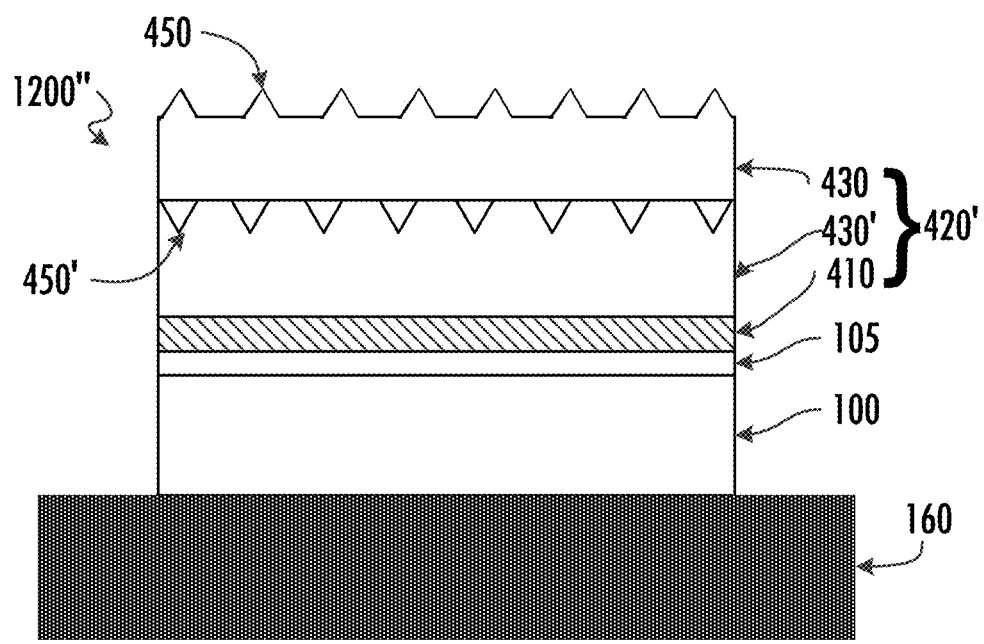

FIGS. 12A-D illustrate embodiments in which a patterned superstrate 430, 430' may be combined with an unpatterned second superstrate 440 to reduce a CoA variation in the light emitted from the semiconductor light emitting device. In some embodiments, more than one patterned superstrate may be combined within a lighting device. FIGS. 12E and 12F are cross-sectional views of semiconductor light emitting devices 1200" according to embodiments of the present invention that include more than one patterned superstrate. For example, as illustrated in FIG. 12E, more than one patterned superstrate 430' may be stacked upon one another to further adjust the light emitted from the semiconductor light emitting device 1200". By using two patterned superstrates 430', light which has passed through a first set of optical elements 450' of the first patterned superstrate 430' may be further reflected by a second set of optical elements 450' of a second patterned superstrate 430'. Though the device 1200" of FIG. 12E illustrates the stacking of two patterned superstrates 430' including optical elements 450' that are indentations, it will be understood that a semiconductor light emitting device may similarly utilize more than two patterned superstrates 430'. Similarly, patterned superstrates including optical elements that are protrusions, such as those illustrated in FIG. 4 may also be stacked upon one another.

Also, patterned superstrates utilizing different types of optical elements may be stacked upon one another. For example, as illustrated in FIG. 12F, a semiconductor light emitting device 1200" may have a patterned superstrate 430 including protruding optical elements 450 stacked on a patterned superstrate 430' including indented optical elements 450'. It will be understood that the order of the stacking illustrated in FIG. 12F is merely an example. In some embodiments, the optical elements of the stacked patterned superstrates may be on shared or opposing surfaces of the stacked patterned superstrate. Referring to both FIGS. 12E and 12F, the stacked patterned superstrates 430, 430' may be combined with the recipient luminophoric medium 410 to form a chip cover 420', but the embodiments described herein are not limited thereto.

Figure 12G:
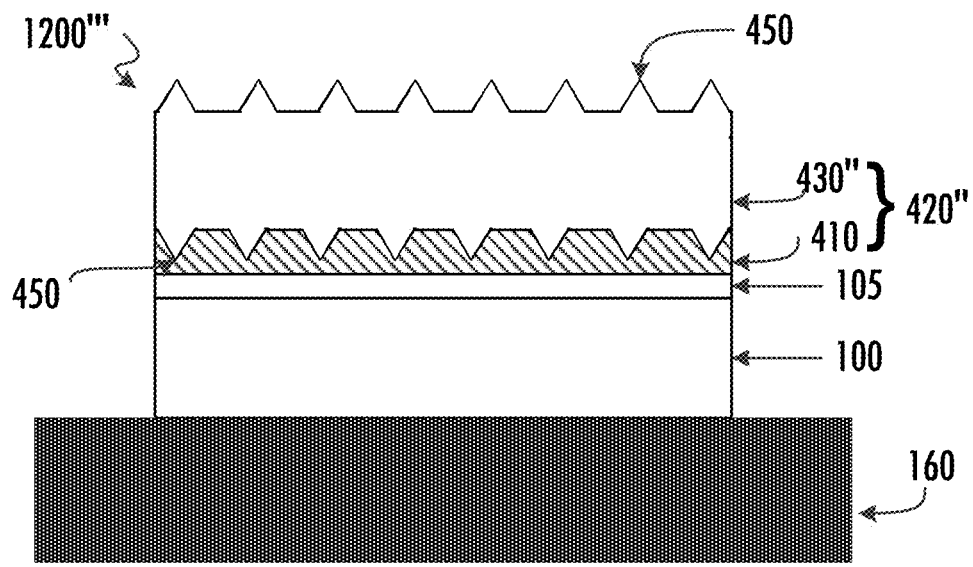
FIGS. 12G and 12H are schematic cross-sectional views of example semiconductor light emitting devices with a patterned superstrate having optical elements on both surfaces.
Figure 12H:
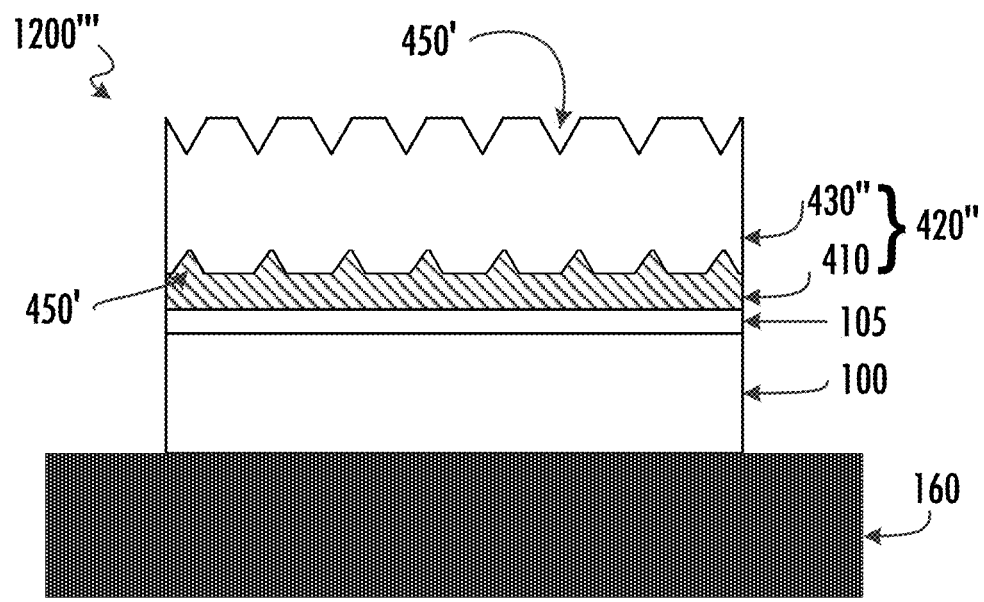

FIGS. 12G and 12H are schematic cross-sectional views of a semiconductor light emitting device 1200" with a patterned superstrate 430" having optical elements 450, 450' on both major surfaces thereof. As illustrated in FIG. 12G, the semiconductor light emitting device 1200" may include, for example, a patterned superstrate 430" that has protruding optical elements 450 on both the upper and lower surfaces of the patterned superstrate 430". Having two sets of optical elements 450 may allow for additional refracting surfaces to further adjust the light reflected by the semiconductor light emitting device 1200". FIG. 12H illustrates an example in which the patterned superstrate 430" includes optical elements 450' that are indentations on both the upper and lower surfaces of the patterned superstrate 430". Referring to both FIGS. 12G and 12H, the stacked patterned superstrates 430" may be combined with the recipient luminophoric medium 410 to form a chip cover 420", but the embodiments described herein are not limited thereto. Though FIGS. 12G and 12H illustrate embodiments in which the patterned superstrates 430" include the same type of optical elements 450, 450', it will be understood that other configurations are possible. For example, in some embodiments, one surface of a patterned superstrate 430" may include optical elements 450 that are protrusions while the other surface may include optical elements 450' that are indentations. Similarly, in some embodiments, one surface of a patterned superstrate may include optical elements 450, 450' that are a first shape (e.g., one of the shapes discussed with respect to FIGS. 6A-8C or others) while the other surface may include optical elements 450, 450' that are a second, different shape.

Figure 13:
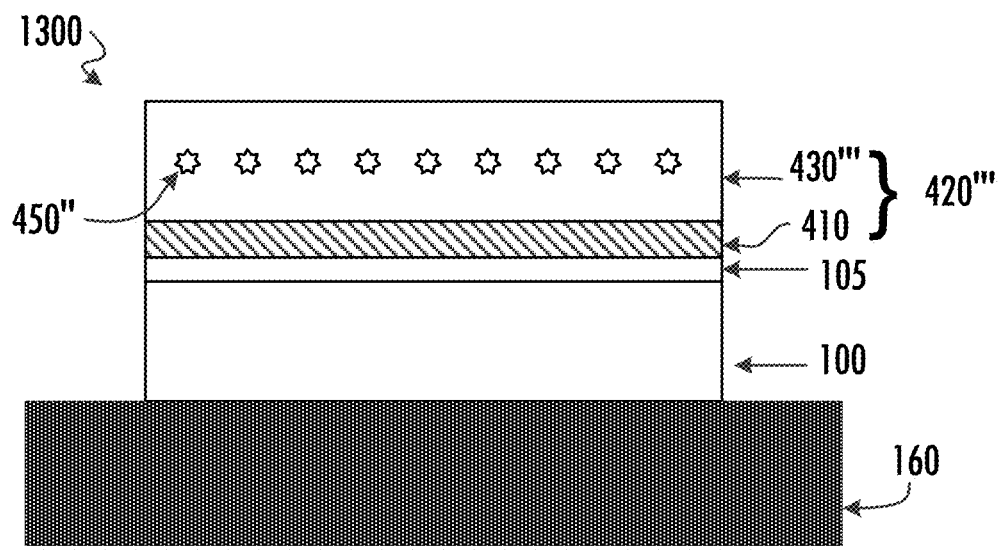
FIG. 13 is a schematic cross-sectional view of a semiconductor light emitting device in which the patterned superstrate includes internal optical elements.

FIG. 13 illustrates a semiconductor light emitting device 1300 in which the patterned superstrate 430''' includes internal optical elements 450". The optical elements 450" may be formed internal to the patterned superstrate 430''' rather than at a surface thereof. In some embodiments, the internal optical elements 450" may be formed by focusing a laser on an internal region of a bulk substrate. The laser may focus energy at the internal region of the bulk substrate so as to cause a micro-fracture within the bulk substrate. The micro-fracture may deform and/or alter the structure of the bulk substrate so as to form the internal optical elements 450". Thus, optical elements 450" may include structural features which are within the patterned superstrate 430''' (e.g., between a top and a bottom surface of the patterned superstrate 430''').

After formation, the bulk substrate may be singulated and placed on the LED chip 100, as described herein with other devices (e.g., semiconductor light emitting device 400 of FIG. 4). In some embodiments, the internal optical elements 450" may be formed in the patterned superstrate 430''' after the patterned superstrate 430''' has been singulated and placed on the LED.

The internal optical elements 450", as illustrated in FIG. 13, may provide additional structures to promote reflection within the patterned superstrate 430'''. As with the semiconductor light emitting device 400 of FIG. 4, the patterned superstrate 430''' and the recipient luminophoric medium 410 of FIG. 13 may be combined into an improved chip cover 420''', but the embodiments described herein are not limited thereto. In some embodiments, the patterned superstrate 430''' may be placed on the LED chip 100 separately from the recipient luminophoric medium 410. In such embodiments, the transparent adhesive layer 105 may not be needed.

Figure 14:
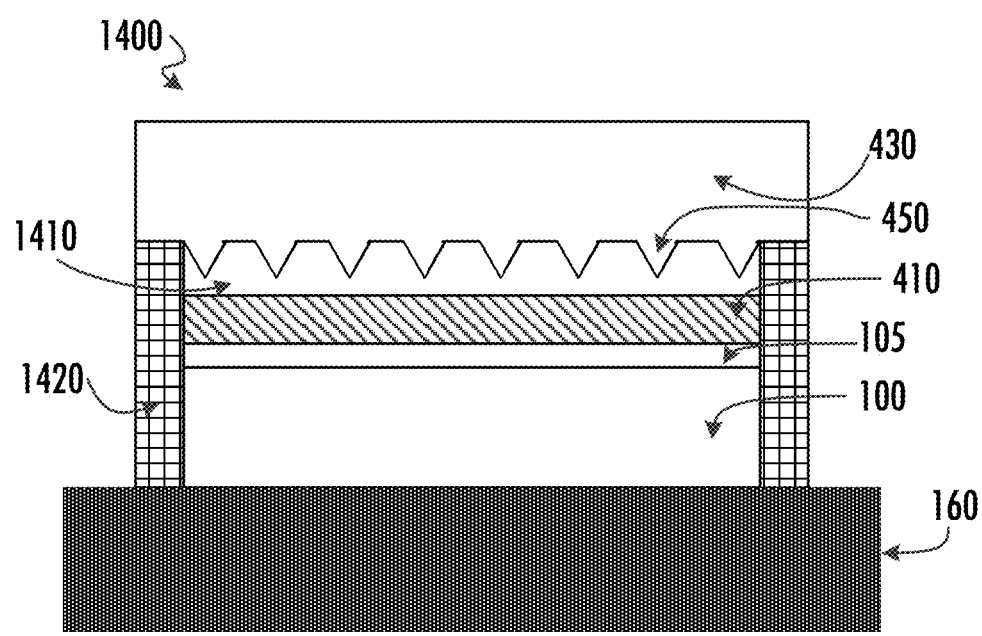
FIG. 14 is a schematic cross-sectional view of a semiconductor light emitting device that further includes an air gap between the patterned superstrate and the recipient luminophoric medium.

FIG. 14 illustrates a semiconductor light emitting device 1400 that includes an air gap 1410 between the patterned superstrate 430 and the recipient luminophoric medium 410.

The semiconductor light emitting device 1400 is similar to that of FIG. 4, and thus a description of similar elements of the semiconductor light emitting device 1400 will be omitted for brevity. The positioning of the air gap 1410 may provide an additional interface between the recipient luminophoric medium 410 and the air gap 1410 that provides an additional index of refraction differential. Thus, light emitting from the recipient luminophoric medium 410 will encounter a first interface with a first index of refraction differential between the recipient luminophoric medium 410 and the air gap 1410, and a second interface with a second index of refraction differential between the air gap 1410 and the patterned superstrate 430. The air gap 1410 may be created by the use of a supporting structure 1420 to elevate the patterned superstrate 430 above the recipient luminophoric medium 410. FIG. 14 illustrates an example in which the supporting structure 1420 is a riser at sides of the LED chip 100 supporting the patterned superstrate 430. However, it will be understood that other types of supporting structures 1420 are possible to create the air gap 1410 without deviating from the embodiments described herein.

Figure 15:
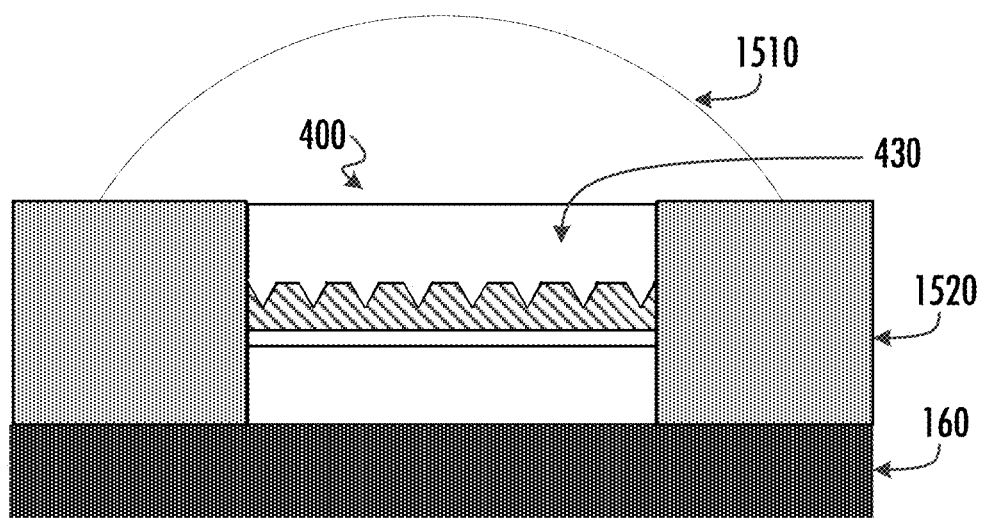
FIG. 15 is a schematic cross-sectional view of the semiconductor light emitting device of FIG. 4 included in a molded lighting apparatus including a lens.

FIG. 15 illustrates the semiconductor light emitting device 400 of FIG. 4 included in a molded lighting apparatus including a lens 1510. The semiconductor light emitting device 400. In some embodiments, a material of the lens 1510 may directly contact an upper surface of the patterned superstrate 430. The material of the lens 1510 may thus provide a different index of refraction for light emitting from the patterned superstrate 430. Accordingly, a configuration of the patterned superstrate 430 may be configured, as described herein, to account for the change in index of refraction as compared to other configurations (e.g., where an air gap exists above the patterned superstrate 430). In some embodiments, an air gap may be provided between the lens 1510 and the patterned superstrate 430, e.g., by using spacers. A fill material 1520 may be provided at sides of the semiconductor light emitting device 400. In some embodiments, the fill material 1520 may be a reflective material configured to assist in the reflection of the light emitted from the semiconductor light emitting device 400. In some embodiments, the fill material 1520 may be an opaque fill. The lens 1510 may be provided to encapsulate the semiconductor light emitting device 400 so as to provide a molded lighting apparatus having a reduced CoA variation. Though FIG. 15 illustrates the use of the semiconductor light emitting device 400, it will be understood that other semiconductor light emitting devices (e.g., semiconductor light emitting devices 1100, 1100', 1200, 1200', 1200'', 1200''', 1300, and 1400) could similarly be used without deviation from the embodiments described herein.

Figure 16:
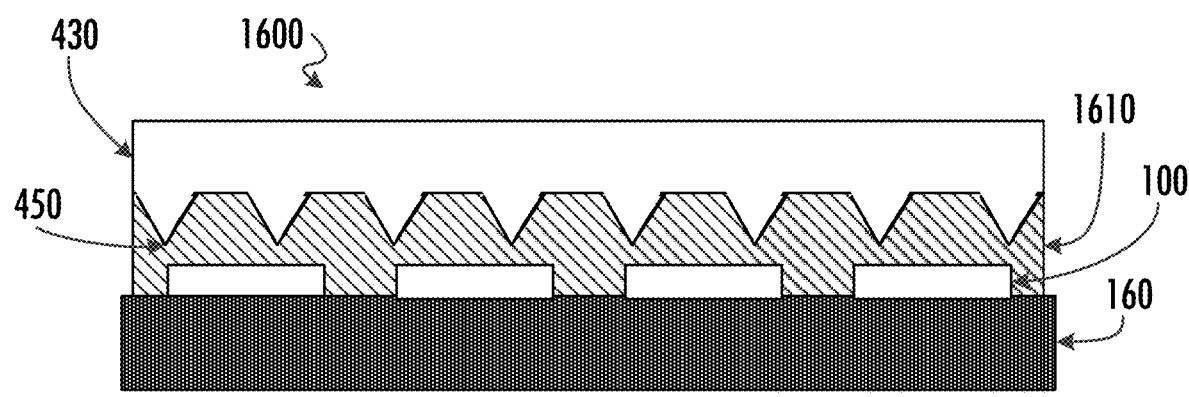
FIG. 16 is a schematic cross-sectional view of a patterned superstrate used in a semiconductor light emitting device that includes a plurality of LED chips.

Though the embodiments described previously include the use of a patterned superstrate 430 with an individual LED chip 100, it will be understood that a patterned superstrate 430 may also be used in conjunction with a plurality of LED chips 100. FIG. 16 illustrates a patterned superstrate 430 used in a semiconductor light emitting device 1600 with a plurality of LED chips 100. Referring to FIG. 16, a plurality of LED chips 100 may be provided on a supporting substrate 160 (e.g., a ceramic substrate). A recipient luminophoric medium 1610 may be provided as an encapsulating fill on a top surface of each of the plurality of LED chips 100. In some embodiments, the recipient luminophoric medium 1610 may be within and, in some embodiments, fill spaces between adjacent ones of the plurality of LED chips 100. The recipient luminophoric medium 1610 may include phosphor and/or other materials such that the recipient luminophoric medium 1610 may perform conversion of light emitted from the plurality of LED chips 100. As with previously discussed devices, the patterned superstrate 430 may be placed on the recipient luminophoric medium 1610 and may contain optical elements 450 configured to reduce a CoA variation of the semiconductor light emitting device 1600. Thus, the patterned superstrate 430 and the recipient luminophoric medium 1610 will perform similar functions to improve a CoA variation with respect to a plurality of LED chips 100 as described herein with respect to individual LEDs.

Though FIG. 16 illustrates a particular embodiment in which the optical elements 450 are presented as optical elements 450 protruding from a bottom surface of the patterned superstrate 430, it will be understood that other embodiments of the patterned superstrate 430, 430', 430'', 430''' may be substituted for the patterned superstrate 430 of FIG. 16 to provide additional semiconductor light emitting devices according to embodiments of the present invention. For example, the patterned superstrate 430 of FIG. 16 may include optical elements 450 on a top surface, bottom surface, and/or middle region of the patterned superstrate 430. The optical elements 450 may be various shapes, including cones, pyramids, and/or other geometric shapes. The optical elements 450 may protrude from the patterned superstrate 430 or be integrated as indentations in the patterned superstrate 430.

Figure 17A:
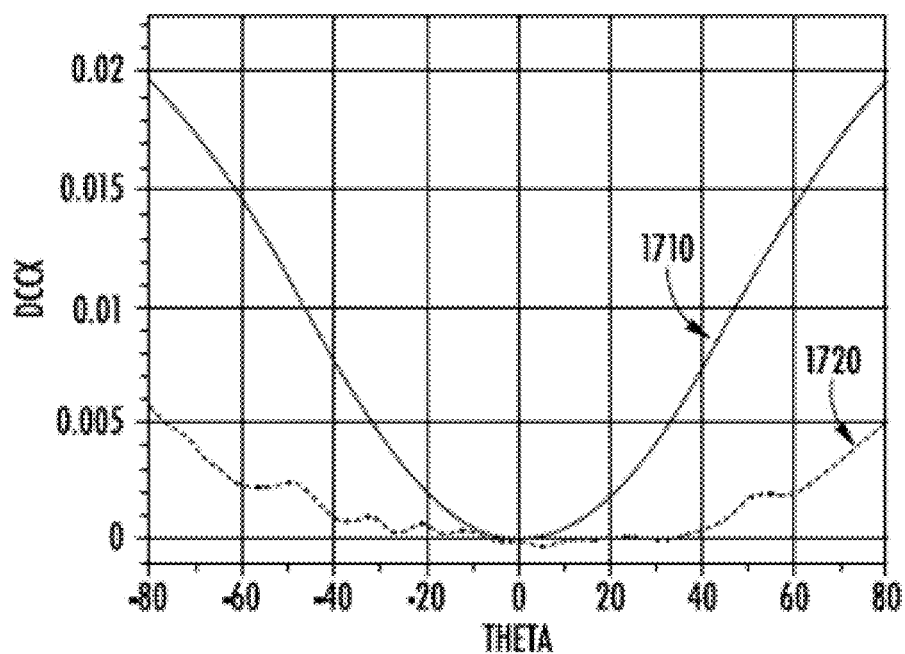
FIGS. 17A and 17B are graphs that illustrate the color over angle variation of conventional devices and of a semiconductor light emitting device according to embodiments of the present invention.
Figure 17B:
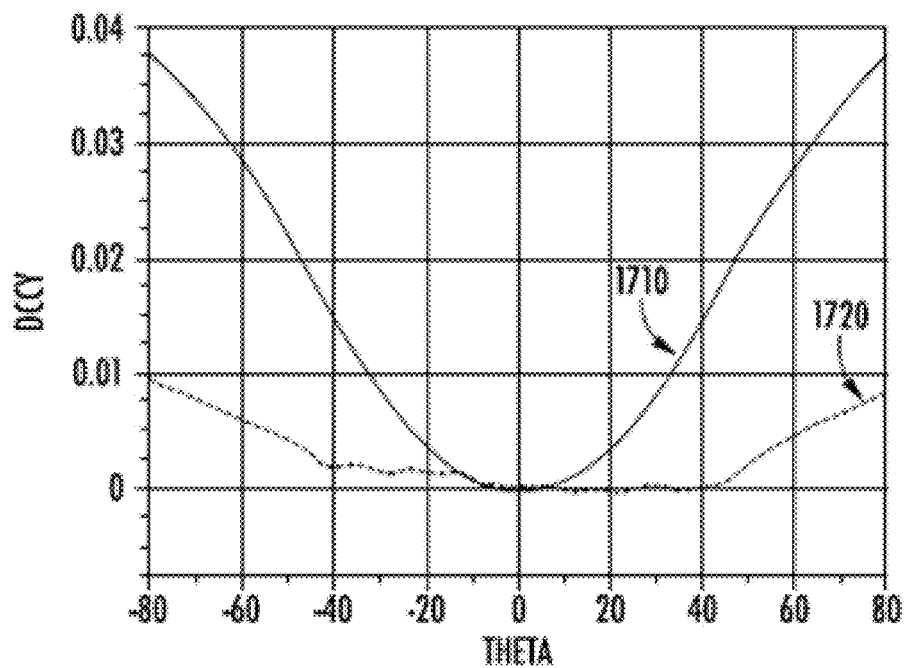
Figure 17C:
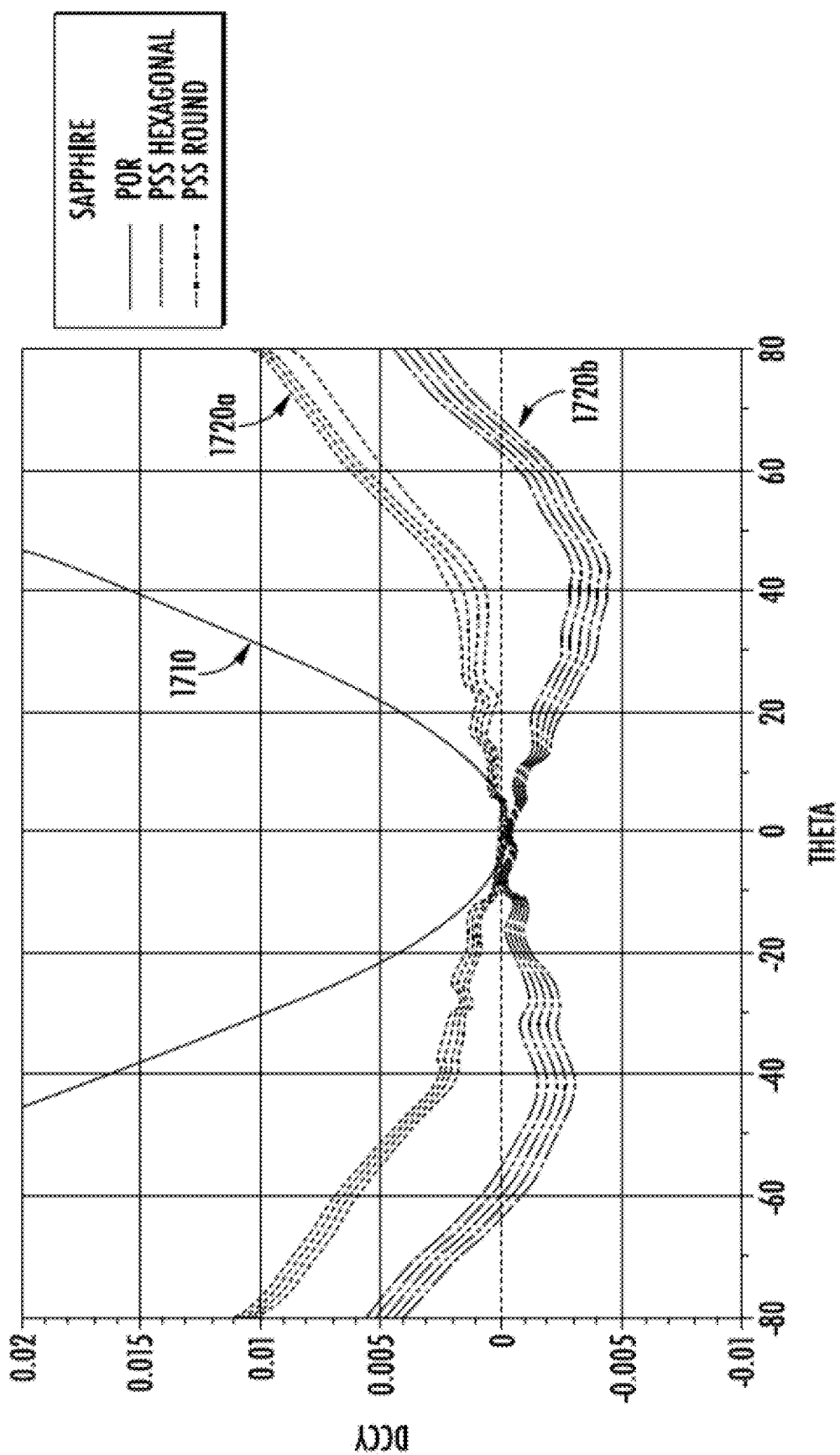
FIG. 17C is a graph that illustrates differences in the color over angle variation performance of semiconductor light emitting devices according to embodiments of the present invention having different types of patterned superstrates.

The semiconductor light emitting devices according to embodiments of the present invention may exhibit an improved CoA variation as compared to conventional devices, as illustrated by FIGS. 17A to 17c. Referring to FIGS. 17A and 17B, the CoA variation of an improved CoA device 1720 including a patterned superstrate is compared to the CoA variation of a conventional device 1710. The conventional device illustrated in FIGS. 17A-C is a chip cover such as that illustrated in FIG. 2, in which a smooth sapphire superstrate (i.e., without patterning and/or optical elements) is placed over a recipient luminophoric medium. FIG. 17A represents the variation in the ccx coordinate (dccx) of the color as a function of viewing angle θ. FIG. 17B represents the variation in the ccy coordinate (dccy) of the color as a function of viewing angle θ. As discussed herein with respect to FIGS. 3B and 3C, the performance of the conventional device 1710 varies significantly as a viewing angle θ increases with respect to an axis that is normal to the emitting surface of the LED. For example, as the viewing angle θ increases, the deviation in both the ccx and ccy direction increases.

As can be seen in FIGS. 17A and 17B, the semiconductor light emitting devices according to embodiments of the present invention exhibit a significant reduction in the variation in the ccx and ccy components of the emitted light for substantially all viewing angles within 75 degrees of an axis that is normal to the light emitting surface of the LED. In fact, both the ccx and ccy components of the emitted light are maintained within a range of 0.01 for substantially all viewing angles within 75 degrees of an axis that is normal to the light emitting surface of the LED. Moreover, both the ccx and ccy components of the emitted light are maintained within a range of 0.005 for substantially all viewing angles within 40 degrees of an axis that is normal to the light emitting surface of the LED.

FIG. 17C illustrates differences in the CoA variation for different types of patterned superstrates. For example, FIG. 17C illustrates the CoA performance of a conventional semiconductor light emitting device 1710 as compared to a semiconductor light emitting device 1720a according to an embodiment of the present invention that has conical (e.g., a round cross-section) optical elements (e.g., an embodiment similar to that described with respect to FIGS. 6A-C) and a semiconductor light emitting device 1720b according to an embodiment of the present invention that has that has hexagonal pyramid optical elements (e.g., an embodiment similar to that described with respect to FIGS. 8A-C). As can be seen in FIG. 17C, both embodiments 1720a and 1720b provide minimal deviation in the ccy direction as compared to the conventional device 1710. In the viewing angle ranges within 60 degrees of an axis that is normal to the light emitting surface of the LED, the embodiment utilizing conical optical elements 1720a has a slightly positive deviation in the ccy component of the emitted light, while the embodiment utilizing the hexagonal pyramid optical elements 1720b has a slight negative deviation in the ccy component of the emitted light, though both embodiments 1720a and 1720b have less deviation than the conventional device 1710.

Figure 18A:
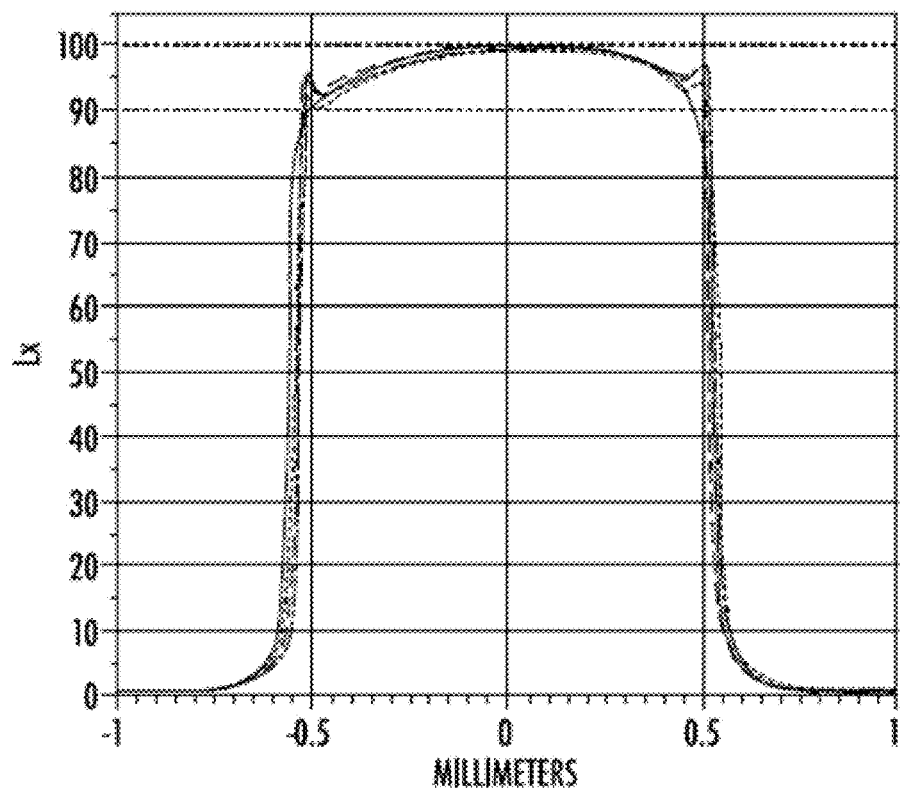
FIGS. 18A and 18B are graphs that illustrate the degradation in sharpness that can be encountered with the use of conventional diffusers as compared to an example semiconductor light emitting device according to embodiments of the present invention.
Figure 18B:
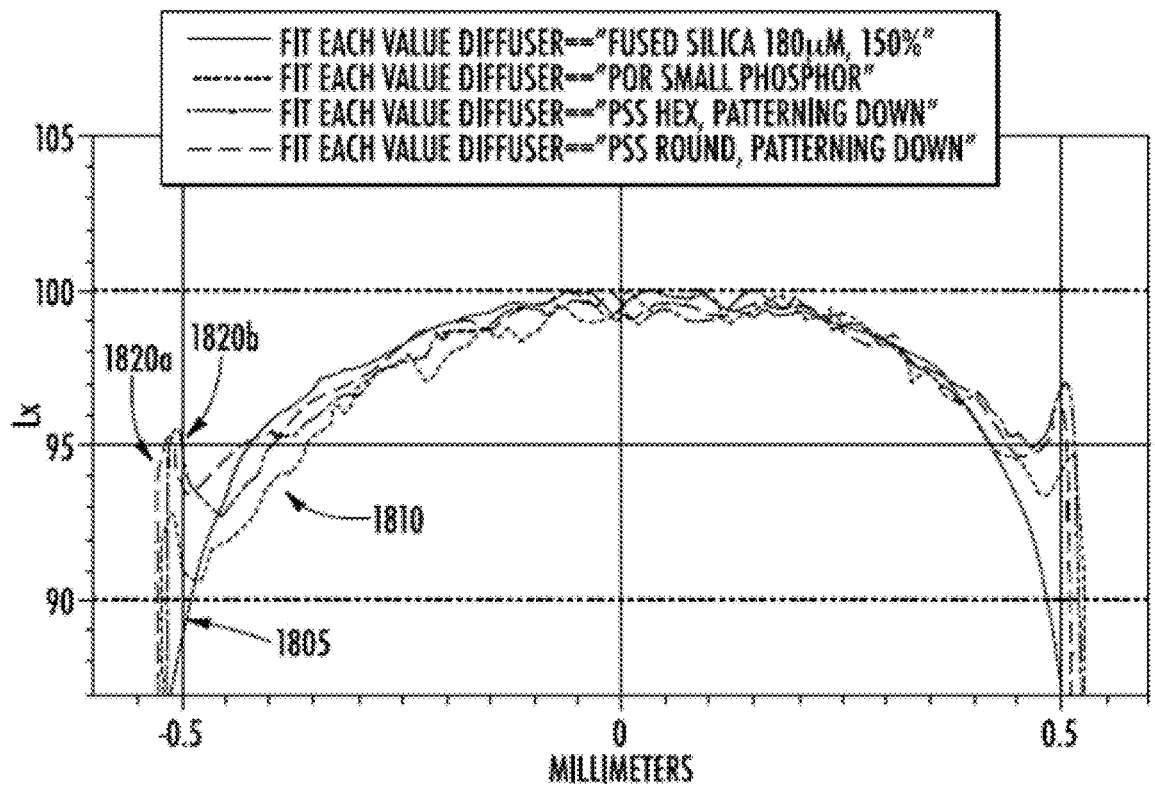

As previously mentioned, some conventional devices utilize a diffuser, such as fused silica, to improve CoA performance. However, such diffusers can degrade a perceived sharpness and contrast of the light. FIGS. 18A and 18B illustrate the degradation in sharpness that can be encountered with the use of diffusers as compared to some embodiments described herein. FIG. 18A illustrates a comparison of relative luminance among different types of semiconductor light emitting devices. In FIG. 18A, the y-axis indicates a relative luminance of light emitted from the semiconductor light emitting device while the x-axis indicates a distance (in millimeters) from the center of the semiconductor light emitting device. In an ideal environment, the relative luminance would be uniform across the entire surface of the semiconductor light emitting device. In reality, the relative luminance tends to be greatest at a central portion of the semiconductor light emitting device. FIG. 18A Compares a conventional device with a fused silica diffuser 1805, a conventional device with a chip cover that includes a smooth sapphire superstrate 1810, a device according to the embodiments described herein with a chip cover that includes a patterned superstrate utilizing conical optical elements 1820a, and a device according to the embodiments described herein with a chip cover that includes a patterned superstrate utilizing hexagonal pyramid optical elements 1820b. FIG. 18B is an expanded version of the upper portion of the graph of FIG. 18A. Referring to FIG. 18B, it can be seen that the conventional devices using both a diffuser 1805 and a smooth sapphire 1810 begin losing relative luminance towards edges of the device relatively earlier than the devices using the patterned superstrate 1820a, 1820b. Moreover, the relative luminance of the devices according to embodiments described herein 1820a, 1820b contains peaks in the relative luminance at the outer edges of the semiconductor light emitting device that are higher than those of the conventional devices 1805, 1810. These peaks may be due to increased light reflection within the semiconductor light emitting devices according to embodiments described herein.

Figure 19A:
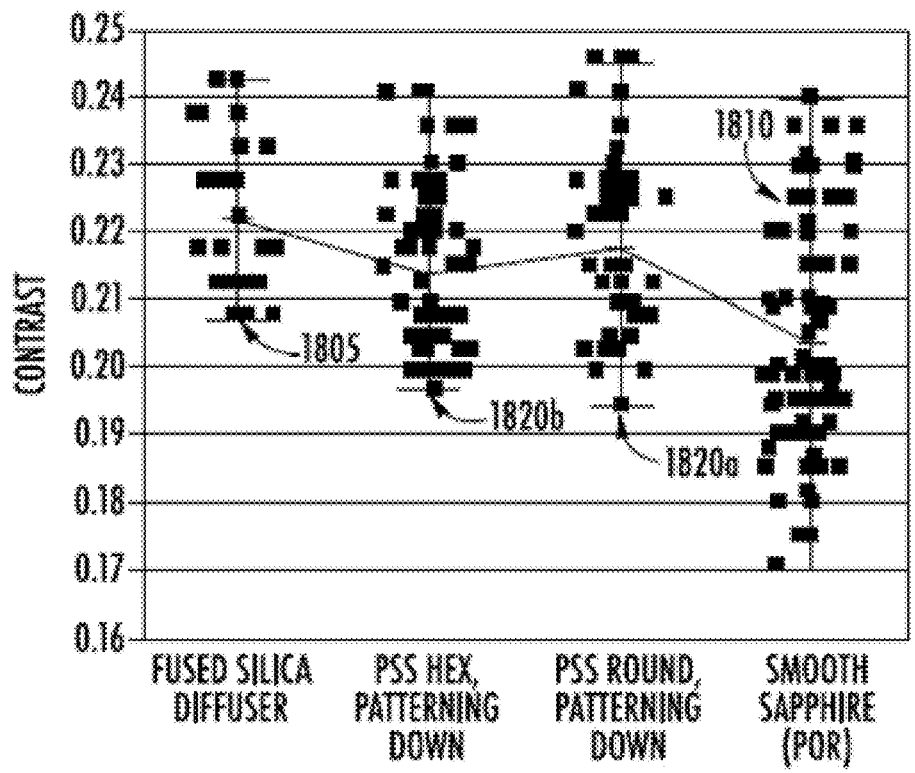
FIGS. 19A and 19B are graphs that illustrate additional performance comparisons between conventional devices and an example semiconductor light emitting device according to embodiments of the present invention.
Figure 19B:
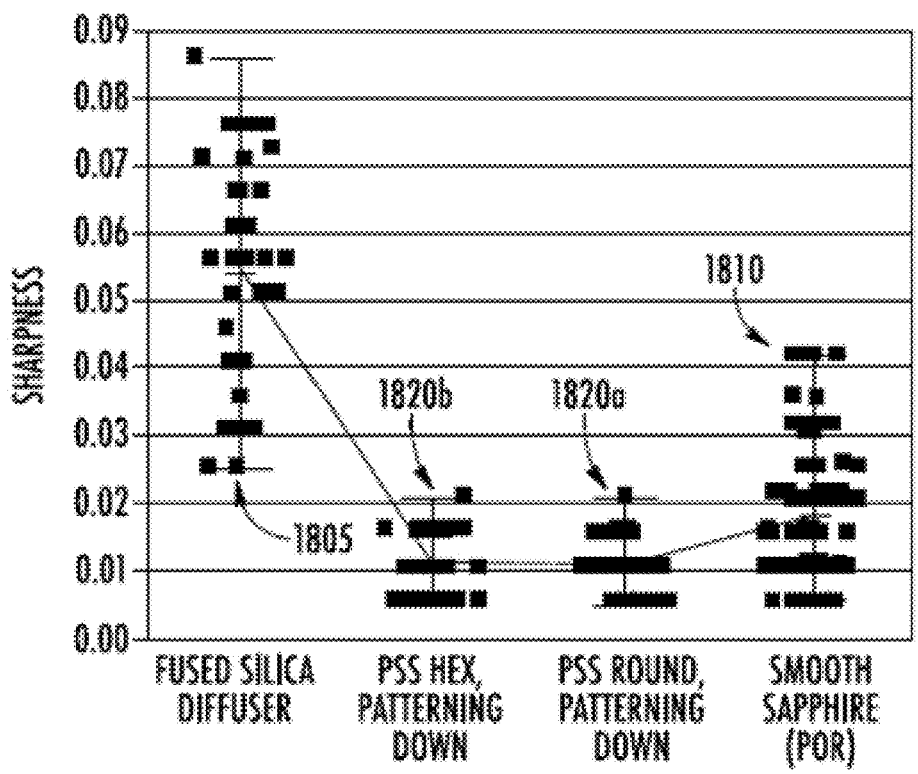

FIGS. 19A and 19B illustrate additional performance comparisons between conventional devices and some embodiments described herein. FIG. 19A illustrates data related to contrast of the emitted light, where lower numbers are generally considered to be better. As can be seen in FIG. 19A, the performance of embodiments using patterned superstrates as described herein 1820a,1820b outperforms conventional devices using diffusers 1805 and is comparable to conventional devices using the smooth sapphire superstrate 1810 while maintaining, as described herein, a smaller CoA variation. Similarly, FIG. 19B illustrates data related to sharpness of the emitted light, where lower numbers are generally considered to be better. Here, the performance of embodiments using patterned superstrates as described herein 1820a,1820b outperforms both conventional devices using diffusers 1805 and conventional devices using the smooth sapphire superstrate 1810.

Figure 20A:
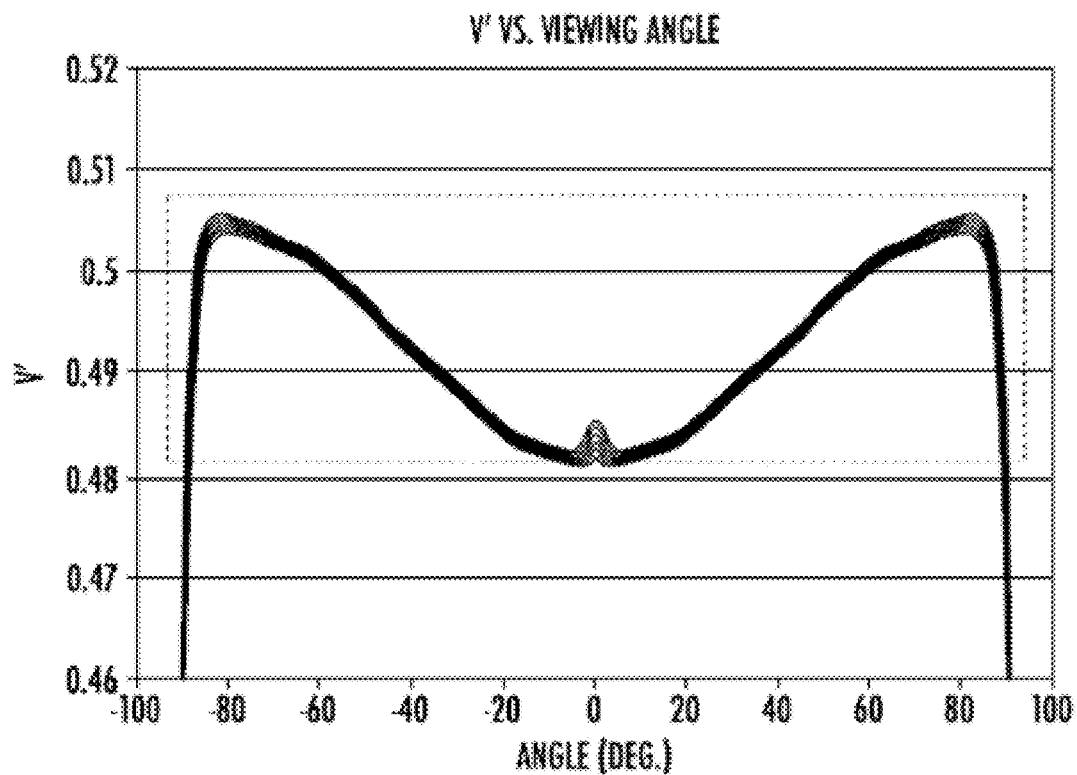
FIGS. 20A and 20B are graphs showing a performance of a conventional semiconductor light emitting device.
Figure 20B:
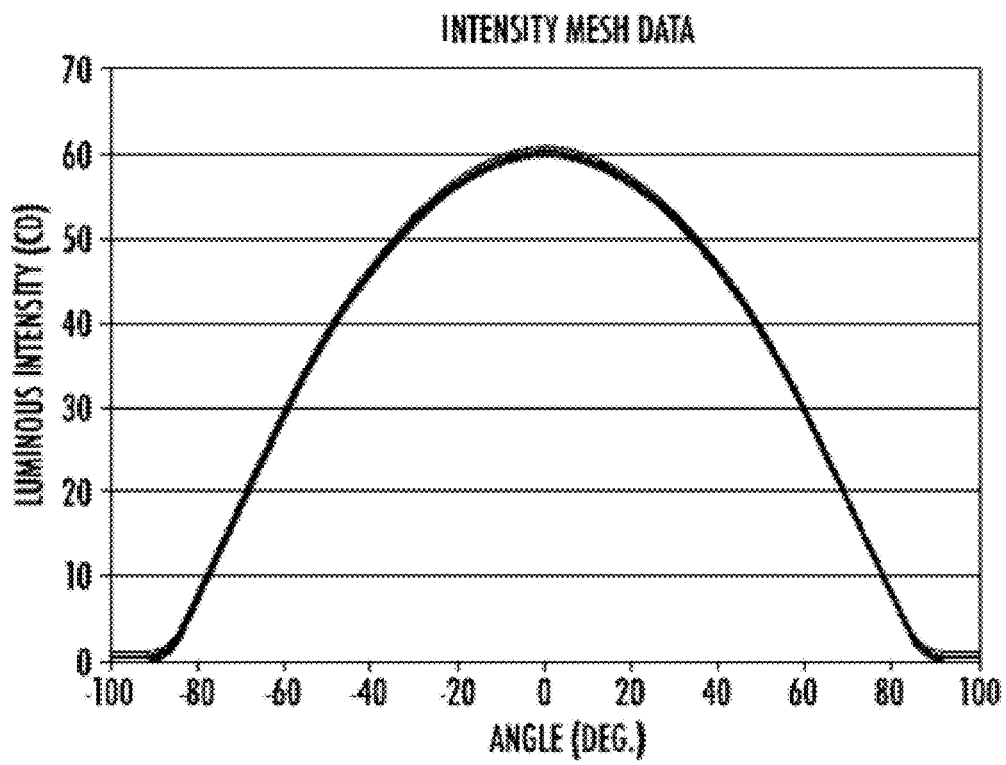

FIGS. 20A and 20B are graphs showing CoA performance of a conventional semiconductor light emitting device. The device modeled in the graphs of FIGS. 20A and 20B is a conventional semiconductor light emitting device similar in structure to that of FIG. 2, including a chip cover that has a smooth sapphire superstrate on a recipient luminophoric medium. FIG. 20A illustrates a variation in the color of light emitted from the conventional semiconductor light emitting device as a function of the viewing angle. FIG. 20A shows a v' coordinate of the emitted light in a 1976 uV CIE Chromaticity Diagram, which is similar to the 1931 CIE Chromaticity Diagram illustrated in FIG. 1, but is modified such that similar distances on the 1976 uV CIE Chromaticity Diagram represent similar perceived differences in color to a human observer. As illustrated in FIG. 20A, for the conventional semiconductor light emitting device, the perceived v' of the light emitted by the semiconductor light emitting device varies between 0.48 and 0.51 as the viewing angle increases from zero degrees to 80 degrees. The small peak or bump around 0 degrees in FIG. 20A is likely due to statistical noise in the data. A spherical mesh may used to collect the data illustrated in FIG. 20A and the "bins" used to collect the data become smaller near the poles (located at 0 and 180 degrees)—much as the slices produced by latitude and longitude lines on a global map become smaller near the poles. Smaller bins mean fewer data points relative to the larger bins near the "equator," and thus more statistical noise (e.g., lower signal-to-noise-ratio) may be possible, resulting in a statistical anomaly near the 0 degree mark. FIG. 20B shows a luminous intensity of the conventional semiconductor light emitting device over the same range of viewing degrees. As can be seen in FIG. 20B, the perceived intensity of the light emitted by the conventional semiconductor light emitting device also varies as a function of the viewing angle.

Figure 21A:
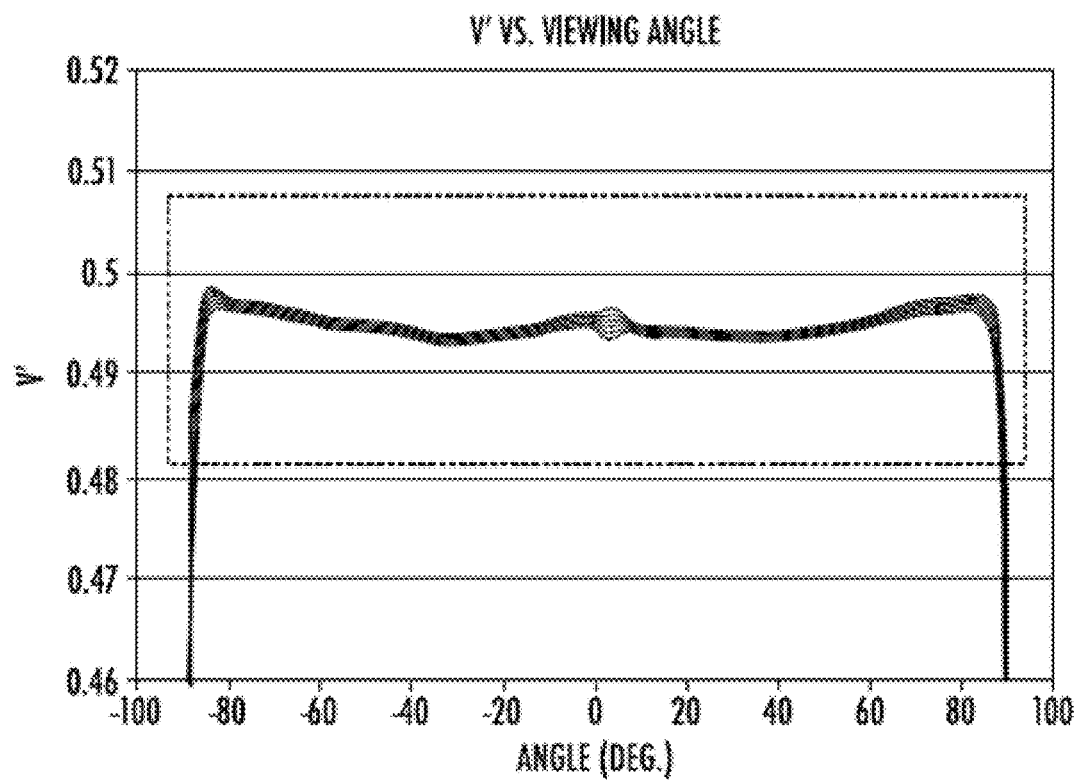
FIGS. 21A and 21B are graphs showing a performance of a device according to some embodiments described herein.
Figure 21B:
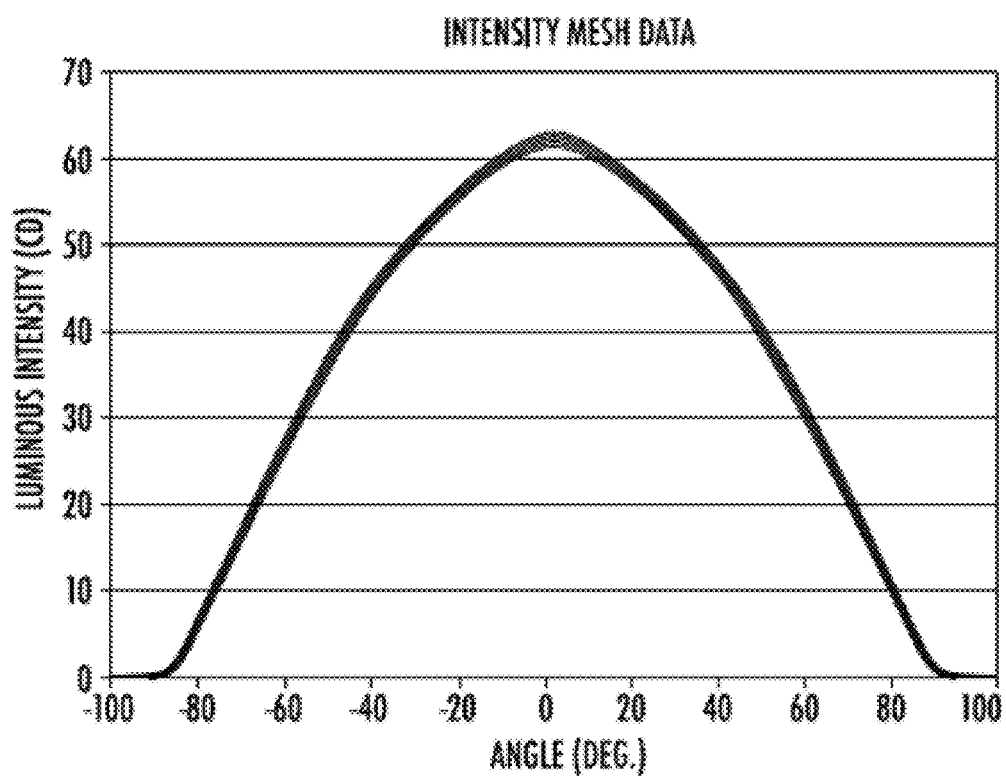

FIGS. 21A and 21B are graphs showing the same performance parameters as FIGS. 20A and 20B for a semiconductor light emitting device according to embodiments of the present invention. The semiconductor light emitting device modeled in the graphs of FIGS. 21A and 21B includes a patterned sapphire superstrate on a recipient luminophoric medium. The patterned superstrate includes optical elements on a lower surface of the patterned superstrate, similar to the device illustrated in FIG. 4, and the optical elements are conical optical elements as discussed herein with respect to FIGS. 6A-6C. FIG. 21A illustrates a variation in the color of light emitted from the semiconductor light emitting device as a function of the viewing angle. FIG. 21A shows that a v' coordinate of the light emitted by the semiconductor light emitting device varies only marginally between 0.49 and 0.5 as the viewing angle increases from zero degrees to 80 degrees. Thus, the semiconductor light emitting device according to embodiments of the present invention has a significantly reduced CoA variation as compared to the conventional device. FIG. 21A illustrates a similar statistical anomaly near the 0 degree mark that is discussed with respect to FIG. 20A. Referring now to FIG. 21B, it can be seen that an intensity graph of the light emitted by the semiconductor light emitting device according to embodiments of the present invention is very similar to that of the conventional device. Therefore, semiconductor light emitting devices according to embodiments of the present invention may reduce a CoA variation of the emitted light with little to no impact on the perceived intensity of the emitted light.

As discussed herein, the optical elements 450 may be various shapes, including shapes with segmented sides and/or rounded sidewalls. The shape of an optical element 450 can be broken into two components—the base shape (e.g., cone, pyramid, hemisphere, etc.) and deviations from the base shape (either intentional or due to etching/processing of the patterned features etc.) such as the bowing or curvature that may be observed along the feature sidewall when viewed in profile (see FIGS. 6C, 7C, 8C).

Figure 22A:
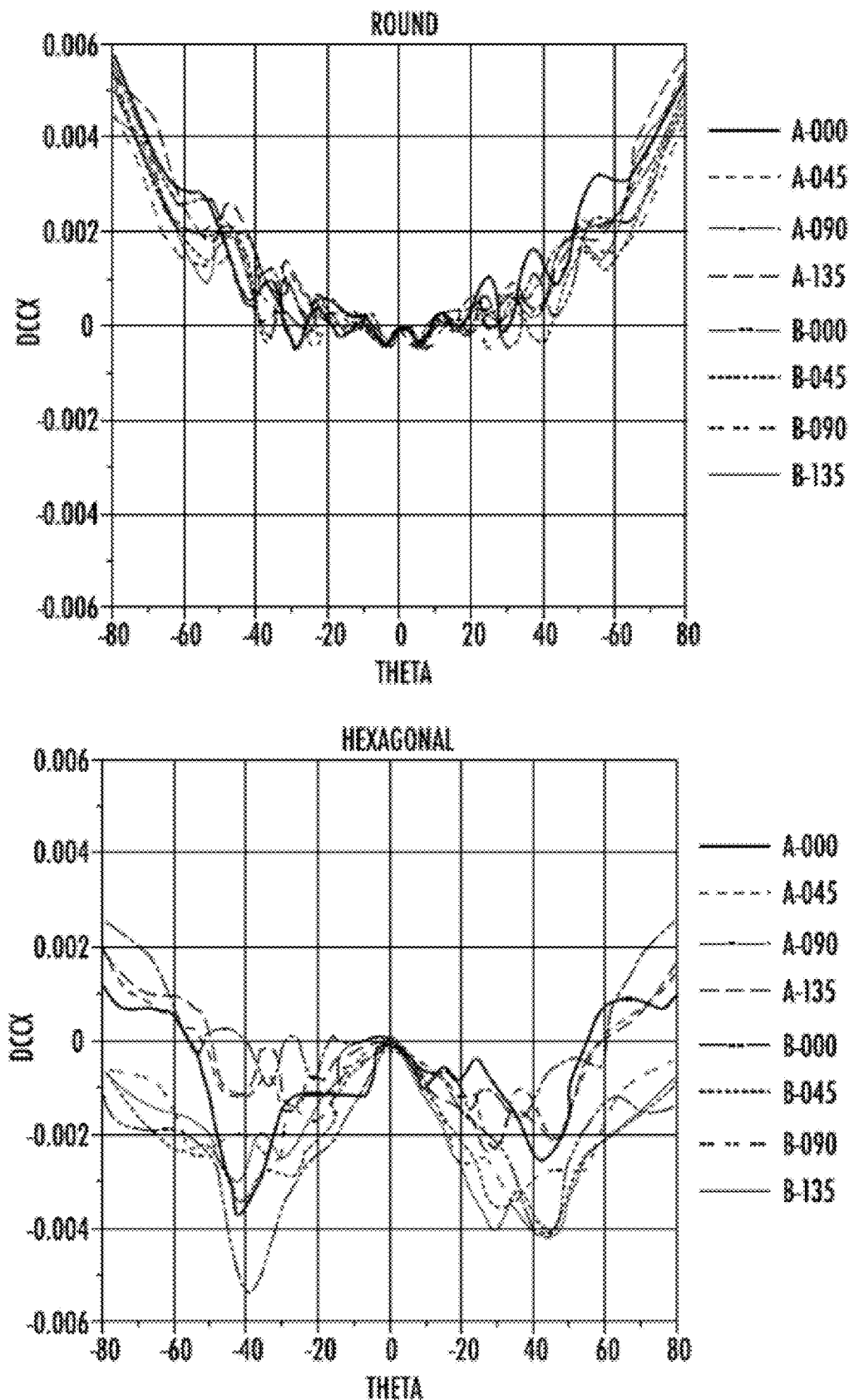
FIGS. 22A and 22B include graphs showing variations in Color-Over-Angle (CoA) in semiconductor light emitting devices including optical elements having a round base and semiconductor light emitting devices including optical elements having a hexagonal base.
Figure 22B:
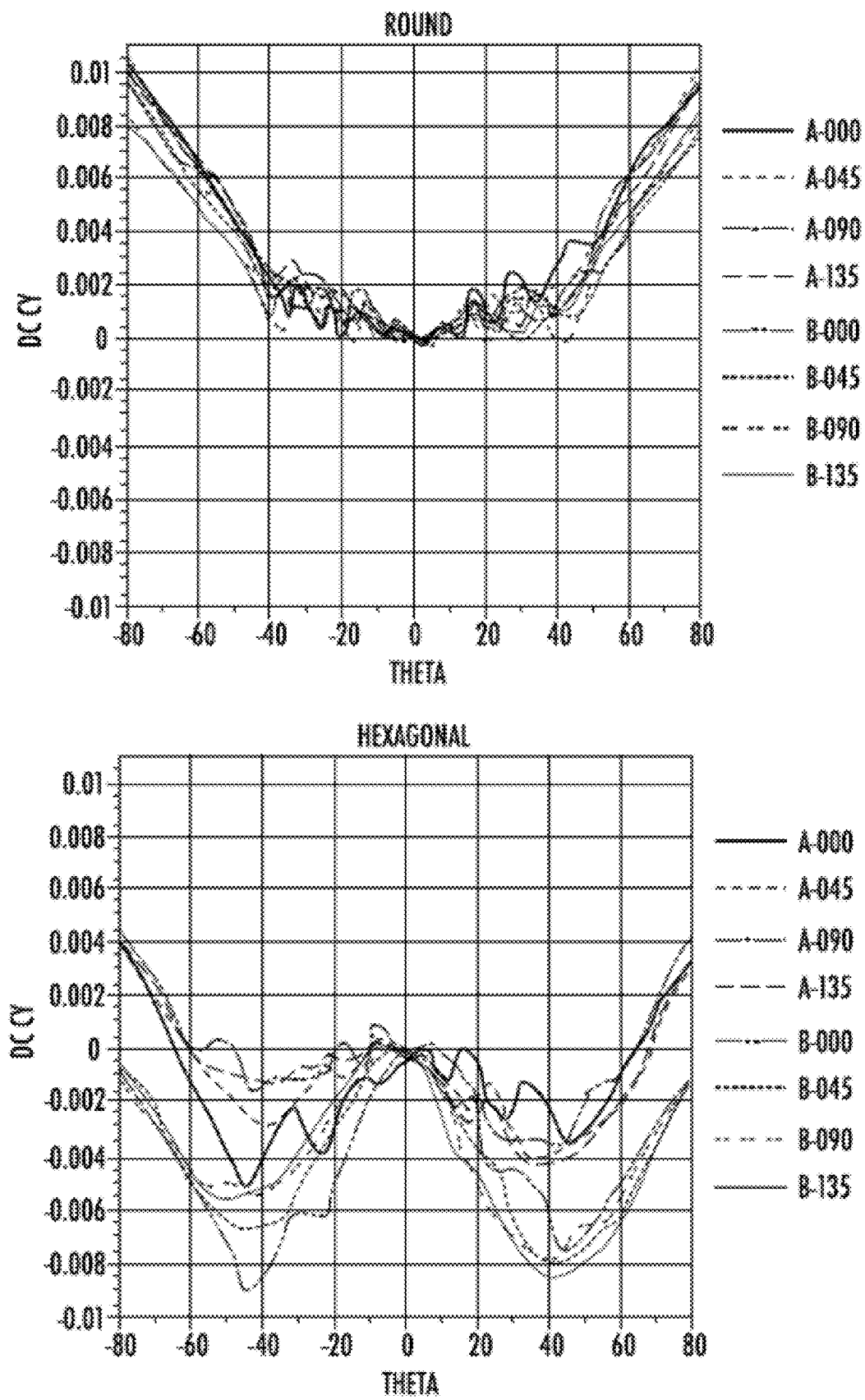

Shapes that are rotationally smooth and symmetric about the primary axis (e.g., cones, spheres, etc.) may have beneficial characteristics over faceted shapes (e.g., as pyramids, prisms, etc.) that may improve radial or azimuthal uniformity. For example, if a cone is viewed at an angle from normal and then rotated about its primary axis (pointing from the base to the tip) the profile does not change. This is not the case with a pyramid. Pyramids, therefore, could result in a change in color uniformity used as part of a patterned superstrate 430. For example, if an LED chip 100 and a patterned superstrate 430 including an optical element 450 having a pyramid shape is viewed at an angle from normal and then rotated, its respective profile may change based, at least in part, on the segmented sides of the pyramid-shaped optical elements 450. In terms of measured data, this could lead to the various curves (representing various measured azimuths) in the dccy plots having significant spread relative to each other, rather than all being identical. In some embodiments, that variation may mean the semiconductor light emitting device would pass the dccy requirement when viewed at certain azimuthal angles, and perform sub-optimally at others. This phenomenon is illustrated in FIGS. 22A and 22B, which include graphs showing variations in CoA in semiconductor light emitting devices including optical elements having a round base (e.g., a conical optical element such as that illustrated in FIGS. 6A-6C) and semiconductor light emitting devices including optical elements having a hexagonal base (e.g., a hexagonal pyramid optical element such as that illustrated in FIGS. 8A-8C). FIG. 22A illustrates dccx variation vs. angle of emitted light and FIG. 22B illustrates dccy variation vs. angle of emitted light. In FIGS. 22A and 22B, individual slices are illustrated from two samples (A and B) taken at different angles (0°, 45°, 90°, 135°) for a conical optical element (labeled as "Round") and a hexagonal pyramid optical element (labeled as "Hexagonal"). As illustrated in FIGS. 22A and 22B, the conical optical element has a smoother variation in CoA performance than that of the hexagonal pyramid optical element.

Adding curvature to the profile (or naturally occurring curvatures) can either help or hurt the CoA uniformity, depending on the dimensions of the underlying base shape. Simulations indicated that the curvature could improve CoA for certain cone height-to-base ratios, and it could actually increase CoA non-uniformity for others. In general, the effects of the two are related, and either can be used (if controllable) to compensate for negative effects brought about by the other.

In some embodiments, optical feature spacing may be used for increasing or decreasing the effects of the pattern. The flat regions between optical features may behave the same as an unpatterned superstrate and thus the light emitted through these regions may have poor CoA uniformity. The effect may be most noticeable at high angles. In some embodiments, the closer together the optical features are, the less the contribution to the emitted light of the semiconductor light emitting device may come from unpatterned regions.

Therefore, as described herein, semiconductor light emitting devices utilizing patterned superstrates may provide improvement with respect to CoA variation without degrading other characteristics of light performance. Because patterning a superstrate for use with the embodiments described herein may use existing equipment with relatively minor modifications to processing techniques, the benefits to the CoA variation in semiconductor light emitting devices may be achieved with minimal disruption or added expense.

As used herein, the term "semiconductor light emitting device" may include LEDs, laser diodes and any other semiconductor light emitting devices that includes one or more semiconductor layers, as well as packaged lamps, bulbs, fixtures and the like which include such semiconductor light emitting devices. The semiconductor layers included in these devices may include silicon, silicon carbide, gallium nitride and/or other semiconductor materials, an optional semiconductor or non-semiconductor substrate, and one or more contact layers which may include metal and/or other conductive materials. The expression "light emitting device" and/or "lighting apparatus," as used herein, is not limited, except that it be a device that is capable of emitting light.

Semiconductor light emitting devices according to embodiments of the disclosure may include III-V nitride (e.g., gallium nitride) based LEDs fabricated on a silicon carbide, sapphire or gallium nitride substrates such as various devices manufactured and/or sold by Cree, Inc. of Durham, N.C. Such LEDs may (or may not) be configured to operate such that light emission occurs through the substrate in a so-called "flip chip" orientation. Semiconductor light emitting devices according to embodiments of the present disclosure include both vertical devices with a cathode contact on one side of the LED, and an anode contact on an opposite side of the LED and devices in which both contacts are on the same side of the device. The design and fabrication of semiconductor light emitting devices are well known to those skilled in the art, and hence further description thereof will be omitted.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The present invention has been described above with reference to the accompanying drawings, in which certain embodiments are shown. However, this disclosure should not be construed as limited to the embodiments set forth herein. Rather, these embodiments are provided so that this disclosure will be thorough and complete, and will fully convey the scope of the disclosure to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated elements and/or components, but do not preclude the presence or addition of one or more other elements, components, and/or groups thereof.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region, or layer discussed below could be termed a second element, component, region, or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

In the drawings and specification, there have been disclosed embodiments of the disclosure and, although specific terms are employed, they are used in a generic and descriptive sense only and not for purposes of limitation, the scope of the disclosure being set forth in the following claims.

That which is claimed is:

1. A semiconductor light emitting device comprising:
   a light emitting diode (LED) chip;
   a recipient luminophoric medium on the LED chip, wherein the recipient luminophoric medium comprises a phosphor material and a binder material and is configured to absorb light of a first color that is emitted by the LED chip and emit light of a second color, different from the first color; and
   a patterned superstrate on the recipient luminophoric medium opposite the LED chip, the patterned superstrate comprising a patterned surface that is configured to reduce a variation in a color point of a light emitted by the semiconductor light emitting device as a function of an angle off an optical axis of the LED chip,
   wherein the patterned surface of the patterned superstrate is on a side of the patterned superstrate that is facing the recipient luminophoric medium.

2. The semiconductor light emitting device of claim 1, wherein the patterned surface comprises a plurality of optical elements.

3. The semiconductor light emitting device of claim 2, wherein the plurality of optical elements are configured to reduce an amount of light emitted by the semiconductor light emitting device while reducing a variation in a color point of the light emitted by the semiconductor light emitting device as a function of viewing angle.

4. The semiconductor light emitting device of claim 2, wherein at least one of the plurality of optical elements comprises a convex protrusion.

5. The semiconductor light emitting device of claim 2, wherein at least one of the plurality of optical elements comprises a concave indentation.

6. The semiconductor light emitting device of claim 2, wherein a height of at least one of the plurality of optical elements is between 1 and three micrometers (μm) and a width of the at least one of the plurality of optical elements is between two and four μm.

7. The semiconductor light emitting device of claim 1, further comprising an air gap between the patterned superstrate and the recipient luminophoric medium.

8. The semiconductor light emitting device of claim 1, wherein the patterned superstrate comprises a first patterned superstrate, and
   wherein the semiconductor light emitting device further comprises a second superstrate on the first patterned superstrate and between the first patterned superstrate and the recipient luminophoric medium, the second superstrate having a major surface adjacent the patterned surface of the first patterned superstrate.

9. The semiconductor light emitting device of claim 1, wherein the patterned surface is configured to reduce the variation in both a ccx and ccy coordinate of the light emitted by the semiconductor light emitting device to within 0.01 for substantially all viewing angles within 40 degrees of an optical axis that extends through the LED chip and that is normal to a major surface of the LED chip.

10. A semiconductor light emitting device comprising:
    a light emitting diode (LED) chip; and
    a chip cover mounted directly on the LED chip, the chip cover comprising:
       a patterned superstrate that comprises a plurality of optical elements; and
       a recipient luminophoric medium on the patterned superstrate,
       wherein the recipient luminophoric medium is between the LED chip and the patterned superstrate,
       wherein the recipient luminophoric medium comprises a phosphor material and a binder material and is configured to absorb light of a first color that is emitted by the LED chip and emit light of a second color, different from the first color, and wherein the plurality of optical elements extend from a side of the patterned superstrate that is facing the recipient luminophoric medium.

11. The semiconductor light emitting device of claim 10, wherein at least one of the plurality of optical elements comprises a convex protrusion.

12. The semiconductor light emitting device of claim 10, further comprising an air gap between the patterned superstrate and the recipient luminophoric medium.

13. The semiconductor light emitting device of claim 10, wherein the plurality of optical elements are configured to reduce an amount of light emitted by the semiconductor light emitting device while reducing a variation in a color point of light emitted by the semiconductor light emitting device as a function of viewing angle.

14. The semiconductor light emitting device of claim 10, wherein the patterned superstrate is configured to reduce a variation in both a ccx and ccy coordinate of light emitted by the semiconductor light emitting device to within 0.01 for substantially all viewing angles within 40 degrees of an optical axis that extends through the LED chip and that is normal to a major surface of the LED chip.

15. The semiconductor light emitting device of claim 4, wherein the convex protrusion comprises a non-linear sidewall extending from a base of the convex protrusion to an upper portion of the convex protrusion.

16. The semiconductor light emitting device of claim 6, wherein a pitch of the plurality of optical elements is between 0.5 to 10 times the width of a respective one of the plurality of optical elements.

17. The semiconductor light emitting device of claim 2, wherein the patterned surface is a first patterned surface, wherein the patterned superstrate comprises a second patterned surface on an opposite side of the patterned superstrate from the first patterned surface, and wherein the plurality of optical elements comprises first optical elements on the first patterned surface and second optical elements on the second patterned surface.

18. The semiconductor light emitting device of claim 1, wherein the patterned superstrate directly contacts the recipient luminophoric medium.

19. The semiconductor light emitting device of claim 8, wherein the first patterned superstrate comprises a plurality of first optical elements, and wherein the second superstrate comprises a second patterned superstrate comprising a plurality of second optical elements.

20. The semiconductor light emitting device of claim 8, wherein the first patterned superstrate comprises a first index of refraction, and wherein the second superstrate comprises a second index of refraction, different from the first index of refraction.

21. A semiconductor light emitting device comprising:

a light emitting diode (LED) chip comprising a light-emitting surface;

a recipient luminophoric medium on the LED chip, wherein the recipient luminophoric medium comprises a phosphor material and a binder material and is configured to absorb light of a first color that is emitted by the LED chip and emit light of a second color, different from the first color;

an adhesive layer between the recipient luminophoric medium and the LED chip; and a patterned superstrate on the recipient luminophoric medium opposite the LED chip, the patterned superstrate comprising:

a first major surface that is facing the recipient luminophoric medium:

a second major surface that is on an opposite side of the patterned superstrate from the first major surface; and a plurality of optical elements between, in a direction normal to the light-emitting surface of the LED chip, the second major surface of the patterned superstrate and the recipient luminophoric medium.

22. The semiconductor light emitting device of claim 21, wherein the plurality of optical elements are internal to the patterned superstrate between the first major surface and the second major surface.

* * * * *